(12) United States Patent
Kato

(10) Patent No.: US 12,369,423 B2
(45) Date of Patent: Jul. 22, 2025

(54) PHOTOELECTRIC CONVERSION DEVICE AND PHOTODETECTION SYSTEM

(71) Applicant: CANON KABUSHIKI KAISHA, Tokyo (JP)

(72) Inventor: Aiko Kato, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 484 days.

(21) Appl. No.: 17/660,057

(22) Filed: Apr. 21, 2022

(65) Prior Publication Data
US 2022/0352234 A1 Nov. 3, 2022

(30) Foreign Application Priority Data
Apr. 28, 2021 (JP) .................. 2021-076569

(51) Int. Cl.
*H10F 39/00* (2025.01)
*H10F 30/225* (2025.01)
*H10F 39/12* (2025.01)

(52) U.S. Cl.
CPC ......... *H10F 39/811* (2025.01); *H10F 30/225* (2025.01); *H10F 39/199* (2025.01);
(Continued)

(58) Field of Classification Search
CPC ........... H01L 27/14636; H01L 27/1463; H01L 27/1464; H01L 31/107
See application file for complete search history.

(56) References Cited

U.S. PATENT DOCUMENTS

| 10,672,818 | B2 * | 6/2020 | Tanaka | .................. H10F 30/225 |
| 2019/0252442 | A1 | 8/2019 | Tanaka | |
| 2021/0184059 | A1 * | 6/2021 | Wang | ...................... H10F 71/00 |

FOREIGN PATENT DOCUMENTS

| JP | 2018-88488 A | 6/2018 |
| JP | 2021-27084 A | 2/2021 |

(Continued)

OTHER PUBLICATIONS

Japanese Office Action issued May 8, 2025 during prosecution of Japanese Application No. 2021-076569 (English translation included).

*Primary Examiner* — Jay C Kim
*Assistant Examiner* — Woo K Lee
(74) *Attorney, Agent, or Firm* — VENABLE LLP

(57) ABSTRACT

The photoelectric conversion device includes a semiconductor layer provided with an avalanche photodiode, and an interconnection structure layer provided on a side of a first surface of the semiconductor layer. The interconnection structure layer includes an interconnection structure made of a metal material and overlapping with the avalanche multiplication region of the avalanche photodiode in a plan view. The interconnection structure includes a first interconnection, a second interconnection disposed farther from the first surface than the first interconnection, and a contact electrode electrically connecting the first interconnection and the second interconnection. An opening is provided in the first interconnection in a portion overlapping with the avalanche multiplication region in the plan view. The second interconnection is disposed so as to overlap an entire of the opening in the plan view. The contact electrode is arranged around the opening in the plan view.

20 Claims, 18 Drawing Sheets

(52) U.S. Cl.
CPC ..... *H10F 39/8057* (2025.01); *H10F 39/8067* (2025.01); *H10F 39/807* (2025.01)

(56) References Cited

FOREIGN PATENT DOCUMENTS

| | | |
|---|---|---|
| JP | 2022-146337 A | 10/2022 |
| WO | 2018/079296 A | 5/2018 |
| WO | 2018/173872 A1 | 9/2018 |
| WO | 2020/179290 A1 | 9/2020 |

\* cited by examiner 148 158 162 130 156 158 136

PHOTOELECTRIC CONVERSION DEVICE AND PHOTODETECTION SYSTEM

BACKGROUND

This application claims the benefit of Japanese Patent Application No. 2021-076569, filed Apr. 28, 2021 which is hereby incorporated by reference herein in its entirety.

Field

The present aspect of the embodiments relates to a photoelectric conversion device and a photodetection system.

Description of the Related Art

A single photon avalanche diode (SPAD) is known as a detector capable of detecting weak light at a single photon level. SPAD amplifies a signal charge excited by a photon by several times to several million times by using an avalanche multiplication phenomenon generated by a strong electric field induced in a p-n junction of a semiconductor. The number of incident photons can be directly measured by converting the current generated by the avalanche multiplication phenomenon into a pulse signal and counting the number of pulse signals.

Japanese Patent Application Laid-Open No. 2018-088488 discloses a sensor chip in which a metal interconnection is used as a reflecting member and light transmitted through the SPAD element is incident on the SPAD element again. However, the effect of improving the sensitivity is not always sufficient by only reflecting the light transmitted through the SPAD element. In particular, in the case of a SPAD element which detects light on a long wavelength side such as a wavelength in a near-infrared region, this phenomenon is prominent.

SUMMARY

An object of the present embodiment is to provide a technique capable of effectively improving light receiving sensitivity in a photoelectric conversion device and a photodetection system.

According to one disclosure of the present specification, there is provided a photoelectric conversion device including a semiconductor layer provided with an avalanche photodiode, and an interconnection structure layer provided on a side of a first surface of the semiconductor layer, wherein the interconnection structure layer includes an interconnection structure made of a metal material and overlapping with an avalanche multiplication region of the avalanche photodiode in a plan view, wherein the interconnection structure includes a first interconnection, a second interconnection disposed farther away from the first surface than the first interconnection, and a contact electrode electrically connecting the first interconnection and the second interconnection, wherein an opening is provided in the first interconnection in a portion overlapping with the avalanche multiplication region in the plan view, wherein the second interconnection is disposed so as to overlap with an entire of the opening in the plan view, and wherein the contact electrode is disposed around the opening in the plan view.

Further features of the present embodiment will become apparent from the following description of exemplary embodiments with reference to the attached drawings.

DESCRIPTION OF THE EMBODIMENTS

Figure 1:
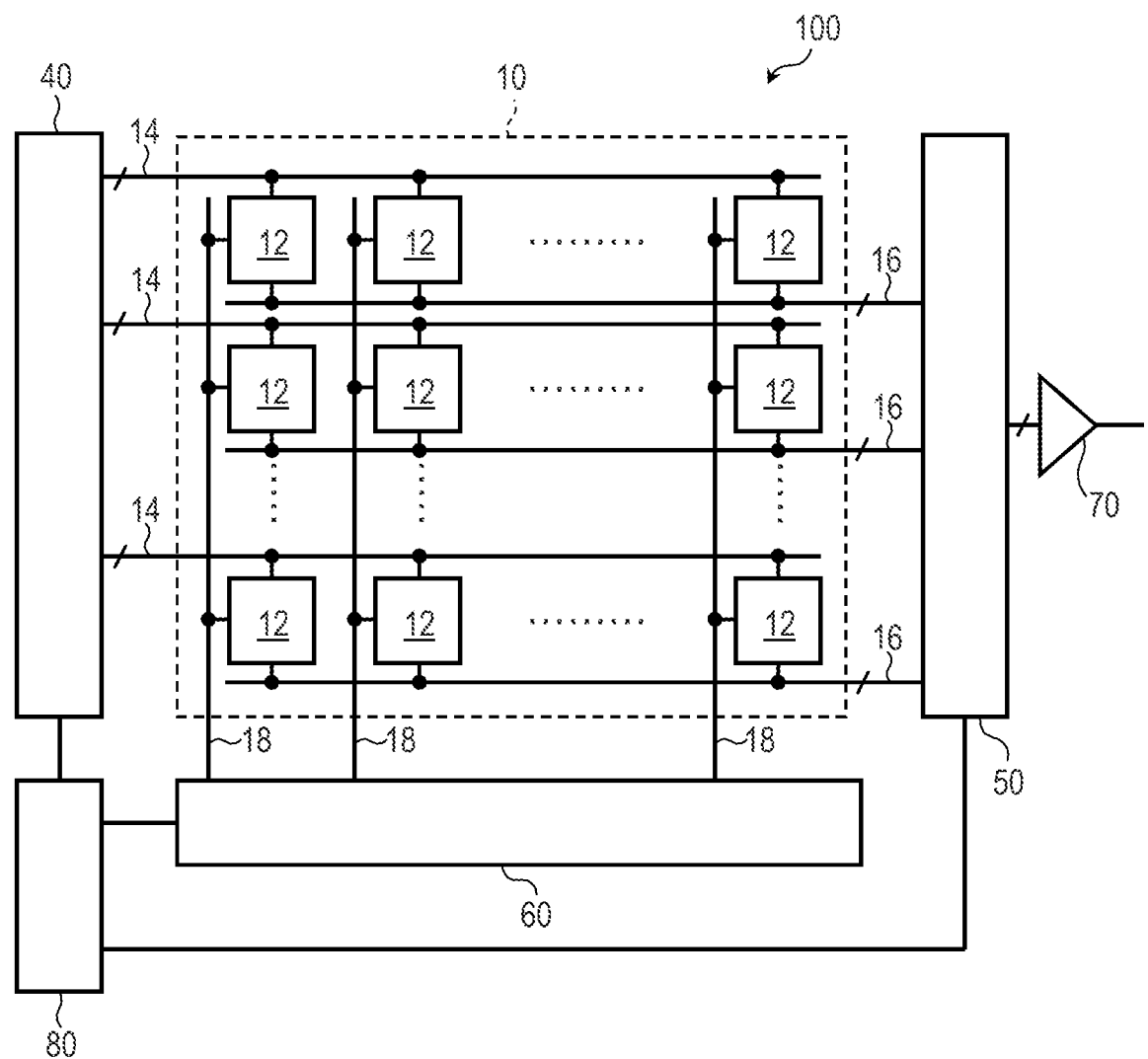
FIG. 1 and FIG. 2 are block diagrams illustrating a schematic configuration of a photoelectric conversion device according to a first embodiment of the present disclosure.

Preferred embodiments of the present disclosure will now be described in detail in accordance with the accompanying drawings.

The following embodiments are intended to embody the technical idea of the present disclosure and do not limit the present disclosure. The sizes and positional relationships of the members illustrated in the drawings may be exaggerated for clarity of description.

First Embodiment

Figure 2:
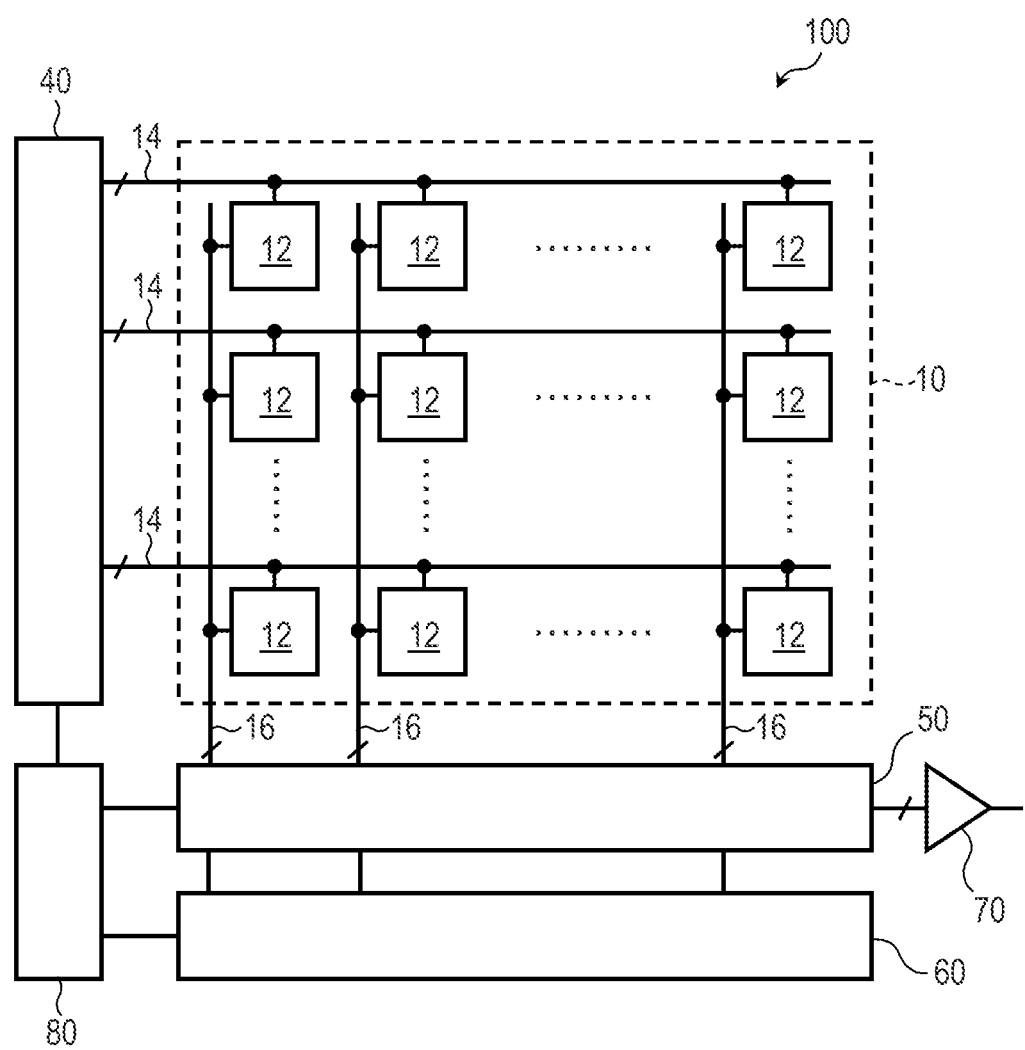
Figure 3:
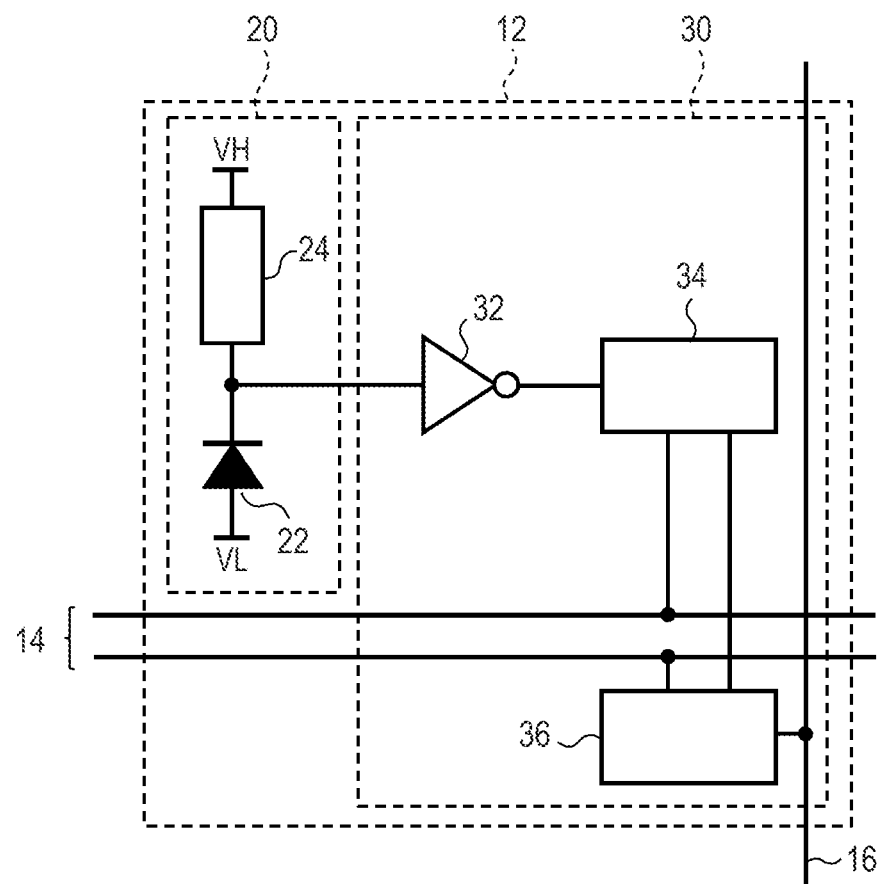
FIG. 3 is a block diagram illustrating a configuration example of a pixel of the photoelectric conversion device according to the first embodiment of the present disclosure.
Figure 4:
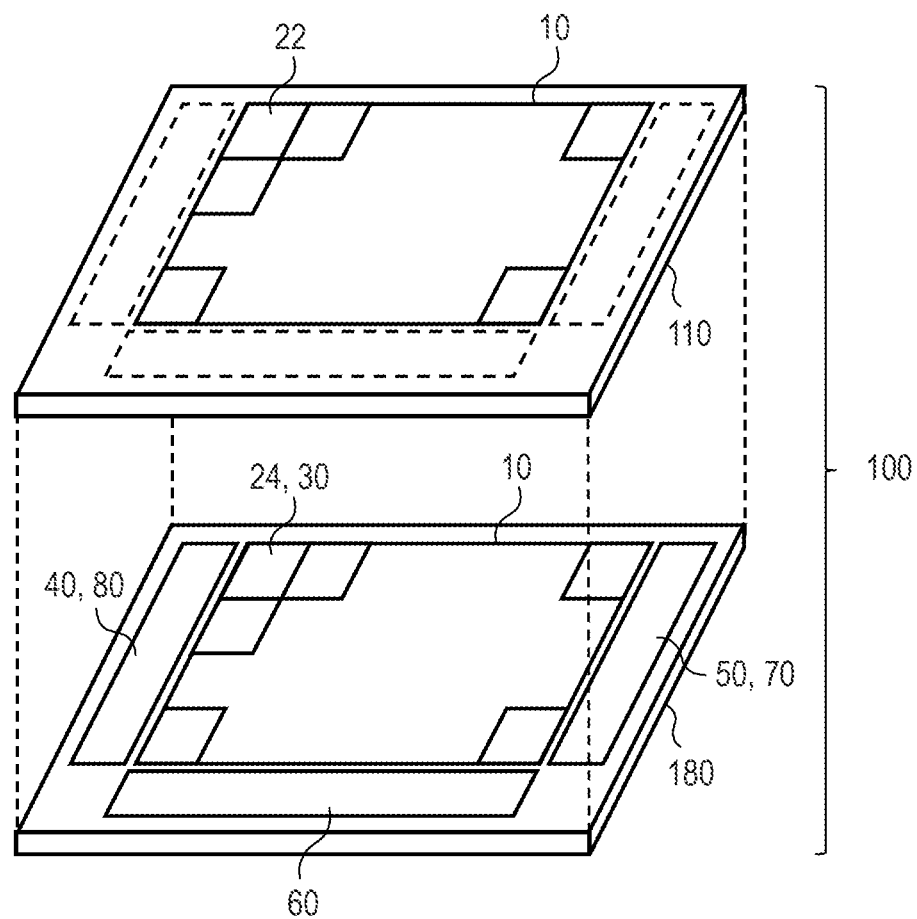
FIG. 4 is a perspective view illustrating a configuration example of the photoelectric conversion device according to the first embodiment of the present disclosure.

A structure of a photoelectric conversion device according to a first embodiment of the present disclosure will be described with reference to FIG. 1 to FIG. 4. FIG. 1 and FIG. 2 are block diagrams illustrating a schematic configuration of the photoelectric conversion device according to the present embodiment. FIG. 3 is a block diagram illustrating a configuration example of a pixel of the photoelectric conversion device according to the present embodiment. FIG. 4 is a perspective view illustrating a configuration example of the photoelectric conversion device according to the present embodiment.

As illustrated in FIG. 1, the photoelectric conversion device 100 according to the present embodiment includes a pixel unit 10, a vertical scanning circuit unit 40, a readout circuit unit 50, a horizontal scanning circuit unit 60, an output circuit unit 70, and a control pulse generation unit 80.

The pixel unit 10 is provided with a plurality of pixels 12 arranged in an array so as to form a plurality of rows and a plurality of columns. As will be described later, each pixel 12 may include a photoelectric conversion unit including a photon detection element and a pixel signal processing unit that processes a signal output from the photoelectric conversion unit. The number of pixels 12 included in the pixel unit 10 is not particularly limited. For example, the pixel unit 10 may be constituted by a plurality of pixels 12 arranged in an array of several thousand rows×several thousand columns like a general digital camera. Alternatively, the pixel unit 10 may be formed of a plurality of pixels 12 arranged in one row or one column. Alternatively, the pixel unit 10 may be formed of one pixel 12.

In each row of the pixel array of the pixel unit 10, a control line 14 is arranged so as to extend in a first direction (a lateral direction in FIG. 1). Each of the control lines 14 is connected to the pixels 12 aligned in the first direction, and forms a signal line common to these pixels 12. The first direction in which the control lines 14 extend may be referred to as a row direction or a horizontal direction. Each of the control lines 14 may include a plurality of signal lines for supplying a plurality of types of control signals to the pixels 12. The control lines 14 in each row are connected to the vertical scanning circuit unit 40.

In each row of the pixel array of the pixel unit 10, a data line 16 is arranged so as to extend in the first direction. Each of the data lines 16 is connected to the pixels 12 aligned in the first direction, and forms a signal line common to these pixels 12. Each of the data lines 16 may include a plurality of signal lines for transferring a digital signal of a plurality of bits output from the pixels 12 on a bit-by-bit basis. The data lines 16 in each row are connected to the readout circuit unit 50.

In each column of the pixel array of the pixel unit 10, a control line 18 is arranged so as to extend in a second direction (vertical direction in FIG. 1) intersecting the first direction. Each of the control lines 18 is connected to the pixels 12 aligned in the second direction, and forms a signal line common to these pixels 12. The second direction in which the control lines 18 extend may be referred to as a column direction or a vertical direction. Each of the control lines 18 may include a plurality of signal lines for supplying a plurality of types of control signals to the pixels 12. The control lines 18 in each row are connected to the horizontal scanning circuit unit 60.

The vertical scanning circuit unit 40 is a control unit having a function of receiving a control signal output from the control pulse generation unit 80, generating a control signal for driving the pixel 12, and supplying the control signal to the pixel 12 via the control line 14. A logic circuit such as a shift register or an address decoder may be used for the vertical scanning circuit unit 40. The vertical scanning circuit unit 40 sequentially supplies control signals to the pixels 12 in the pixel unit 10 row by row, and sequentially drives the pixels 12 in the pixel unit 10 row by row.

The horizontal scanning circuit unit 60 is a control unit having a function of receiving a control signal output from the control pulse generation unit 80, generating a control signal for driving the pixel 12, and supplying the control signal to the pixel 12 via the control line 18. A logic circuit such as a shift register or an address decoder may be used for the horizontal scanning circuit unit 60. The horizontal scanning circuit unit 60 sequentially scans the pixels 12 in the pixel unit 10 column by column, and outputs pixel signals held by the pixels 12 to the readout circuit unit 50 via the data lines 16.

The readout circuit unit 50 includes a plurality of holding units (not illustrated) provided corresponding to each row of the pixel array of the pixel unit 10. The readout circuit unit 50 has a function of holding the pixel signals of the pixels 12 of each row output from the pixel unit 10 via the data lines 16 in units of columns in the holding units provided corresponding to each row. The readout circuit unit 50 receives the control signal supplied from the control pulse generation unit 80, and sequentially outputs the pixel signals held in the holding units of each row to the output circuit unit 70.

The output circuit unit 70 has an external interface circuit and is a circuit unit for outputting the pixel signals output from the readout circuit unit 50 to the outside of the photoelectric conversion device 100. The external interface circuit included in the output circuit unit 70 is not particularly limited. As the external interface circuit, for example, SerDes (SERializer/DESerializer) transmission circuits such as LVDS (Low Voltage Differential Signaling) circuits and SLVS (Scalable Low Voltage Signaling) circuits may be applied.

The control pulse generation unit 80 is a control circuit for generating a control signal for controlling the operation and timing of the vertical scanning circuit unit 40, the readout circuit unit 50, and the horizontal scanning circuit unit 60, and supplying the control signal to each functional block. At least a part of control signals for controlling the operation and timing of the vertical scanning circuit unit 40, the readout circuit unit 50, and the horizontal scanning circuit unit 60 may be supplied from the outside of the photoelectric conversion device 100.

Note that the connection mode of each functional block of the photoelectric conversion device 100 is not limited to the configuration example illustrated in FIG. 1, and may be configured as illustrated in FIG. 2, for example.

In the configuration example of FIG. 2, the data lines 16 extending in the second direction are arranged in each column of the pixel array of the pixel unit 10. Each of the data lines 16 is connected to the pixels 12 aligned in the second direction, and forms a signal line common to these pixels 12. The data lines 16 in each column are connected to the readout circuit unit 50.

The readout circuit unit 50 includes a plurality of holding units (not illustrated) provided corresponding to respective columns of the pixel array of the pixel unit 10. The readout circuit unit 50 is a receiving circuit that receives the pixel signals output via the data lines 16, and has a function of holding the pixel signals of the pixels 12 of each column output from the pixel unit 10 via the data lines 16 in units of rows in the holding units provided corresponding to each column.

The horizontal scanning circuit unit 60 receives the control signal output from the control pulse generation unit 80, generates a control signal for reading out the pixel signal from the holding unit of each column of the readout circuit unit 50, and supplies the control signal to the readout circuit unit 50. The horizontal scanning circuit unit 60 sequentially scans the holding units of the respective columns of the readout circuit unit 50, and sequentially outputs pixel signals held in the holding units to the output circuit unit 70.

Other functional blocks in the configuration example of FIG. 2 may be similar to those in the configuration example of FIG. 1.

As illustrated in FIG. 3, each pixel 12 includes a photoelectric conversion unit 20 and a pixel signal processing unit 30. The photoelectric conversion unit 20 includes a photon detection element 22 and a quenching element 24. The pixel signal processing unit 30 includes a waveform shaping circuit 32, a processing circuit 34, and a pixel output circuit 36.

The photon detection element 22 may be an avalanche photodiode (hereinafter referred to as "APD"). An anode of the APD constituting the photon detection element 22 is connected to a node to which the voltage VL is supplied. A cathode of the APD constituting the photon detection element 22 is connected to one terminal of the quenching element 24. A connection node between the photon detection element 22 and the quenching element 24 is an output node of the photoelectric conversion unit 20. The other terminal of the quenching element 24 is connected to a node to which a voltage VH higher than the voltage VL is supplied. The voltage VL and the voltage VH are set such that a reverse bias voltage sufficient for the APD to perform an avalanche multiplication operation is applied. In one example, a negative high voltage is applied as the voltage VL, and a positive voltage approximately equal to the power supply voltage is applied as the voltage VH. For example, the voltage VL is −30 V and the voltage VH is 1 V.

The photon detection element 22 may be comprised of an APD as described above. When a reverse bias voltage sufficient to perform the avalanche multiplication operation is supplied to the APD, a charge generated by light incidence on the APD cause avalanche multiplication, and an avalanche current is generated. Operation modes in a state where a reverse bias voltage is supplied to the APD include a Geiger mode and a linear mode. The Geiger mode is an operation mode in which a voltage applied between the anode and the cathode is set to a reverse bias voltage higher than the breakdown voltage of the APD. The linear mode is an operation mode in which a voltage applied between the anode and the cathode is set to a reverse bias voltage close to or lower than the breakdown voltage of the APD. The APD operating in the Geiger mode is called SPAD (Single Photon Avalanche Diode). The APD constituting the photon detection element 22 may operate in a linear mode or in a Geiger mode. In particular, SPAD is preferable because the potential difference becomes large and the effect of withstand voltage becomes significant as compared with the linear mode APD.

The quenching element 24 has a function of converting a change in the avalanche current generated in the photon detection element 22 into a voltage signal. The quenching element 24 functions as a load circuit (quenching circuit) at the time of signal multiplication by avalanche multiplication, and has a function of reducing the voltage applied to the photon detection element 22 to suppress avalanche multiplication. The operation in which the quenching element 24 suppresses the avalanche multiplication is called a quenching operation. Further, the quenching element 24 has a function of returning the voltage supplied to the photon detection element 22 to the voltage VH by flowing the current corresponding to the voltage drop caused by the quenching operation. The operation in which the quenching element 24 returns the voltage supplied to the photon detection element 22 to the voltage VH is called a recharging operation. The quenching element 24 may be formed of a resistor, a MOS transistor, or the like.

The waveform shaping circuit 32 has an input node to which an output signal of the photoelectric conversion unit 20 is supplied and an output node. The waveform shaping circuit 32 has a function of converting an analog signal supplied from the photoelectric conversion unit 20 into a pulse signal. The waveform shaping circuit 32 may be configured by a logic circuit including a NOT circuit (inverter circuit), NOR circuit, NAND circuit, and the like. The output node of the waveform shaping circuit 32 is connected to the processing circuit 34.

The processing circuit 34 may include an input node to which an output signal of the waveform shaping circuit 32 is supplied, an input node connected to the control line 14, and an output node. The processing circuit 34 is a functional block that performs predetermined processing on the pulse signal output from the waveform shaping circuit 32, and an example thereof is a counter. When the processing circuit 34 is a counter, the processing circuit 34 may have a function of counting pulses superimposed on a signal output from the waveform shaping circuit 32 and holding a count value as a counting result. The signal supplied from the vertical scanning circuit unit 40 to the processing circuit 34 via the control line 14 may include an enable signal for controlling the pulse counting period (exposure period), a reset signal for resetting the count value held by the processing circuit 34, and the like. The output node of the processing circuit 34 is connected to the data line 16 via the pixel output circuit 36.

The pixel output circuit 36 has a function of switching an electrical connection state (connection or disconnection) between the processing circuit 34 and the data line 16. The pixel output circuit 36 switches the connection state between the processing circuit 34 and the data line 16 in response to a control signal supplied from the horizontal scanning circuit unit 60 via the control line 18 (or a control signal supplied from the vertical scanning circuit unit 40 via the control line 14 in the configuration example of FIG. 2). The pixel output circuit 36 may include a buffer circuit for outputting a signal.

The pixel 12 is typically a unit structure that outputs a pixel signal for forming an image. However, when the purpose is to perform distance measurement using a TOF (Time of Flight) method, the pixels 12 need not necessarily be a unit structure that outputs a pixel signal for forming an image. That is, the pixel 12 may be a unit structure that outputs a signal for measuring the time at which light reaches and the amount of light.

Note that the pixel signal processing unit 30 is not necessarily provided for each pixel 12, and one pixel signal processing unit 30 may be provided for a plurality of pixels 12. In this case, signal processing of a plurality of pixels 12 may be sequentially executed using the one pixel signal processing unit 30.

The photoelectric conversion device 100 according to the present embodiment may be formed on one substrate, or may be formed as a stacked-type photoelectric conversion device in which a plurality of substrates is stacked. In the latter case, for example, as illustrated in FIG. 4, the photoelectric conversion device may be configured as a stacked-type photoelectric conversion device in which a sensor substrate 110 and a circuit substrate 180 are stacked and electrically connected. In the sensor substrate 110, at least the photon detection element 22 among the components of the pixel 12 may be disposed. Among the components of the pixel 12, the quenching element 24 and the pixel signal processing unit 30 may be arranged on the circuit substrate 180. The photon detection element 22, and the quenching element 24 and the pixel signal processing unit 30 are electrically connected to each other via a connection interconnection provided for each pixel 12. The circuit substrate 180 may further include a vertical scanning circuit unit 40, a readout circuit unit 50, a horizontal scanning circuit unit 60, an output circuit unit 70, a control pulse generation unit 80, and the like.

The photon detection element 22, and the quenching element 24 and the pixel signal processing unit 30 of each pixel 12 are provided on the sensor substrate 110 and the circuit substrate 180 so as to overlap each other in a plan view. The vertical scanning circuit unit 40, the readout circuit unit 50, the horizontal scanning circuit unit 60, the output circuit unit 70, and the control pulse generation unit 80 may be arranged around the pixel unit 10 including the plurality of pixels 12. In this specification, "plan view" refers to viewing from a direction perpendicular to the light incident surface of the sensor substrate 110.

By configuring the stacked-type photoelectric conversion device 100, integration of elements may be increased and high functions may be achieved. In particular, by arranging the photon detection element 22, and the quenching element 24 and the pixel signal processing unit 30 on different substrates, the photon detection elements 22 may be arranged at high density without sacrificing the light receiving area of the photon detection element 22, and the photon detection efficiency may be improved.

Note that the number of substrates constituting the photoelectric conversion device 100 is not limited to two, and the photoelectric conversion device 100 may be formed by stacking three or more substrates.

Although a diced chip is assumed as the sensor substrate 110 and the circuit substrate 180 in FIG. 4, the sensor substrate 110 and the circuit substrate 180 are not limited to chips. For example, each of the sensor substrate 110 and the circuit substrate 180 may be a wafer. In addition, the sensor substrate 110 and the circuit substrate 180 may be diced after being stacked in a wafer state, or may be stacked and bonded after being formed into chips.

Figure 5A:
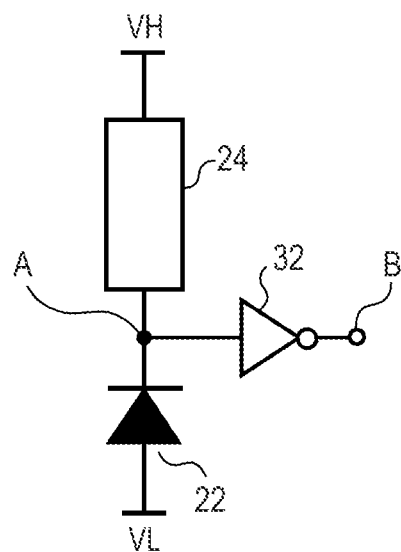
FIG. 5A, FIG. 5B, and FIG. 5C are diagrams illustrating a basic operation of the photoelectric conversion unit in the photoelectric conversion device according to the first embodiment of the present disclosure.
Figure 5B:
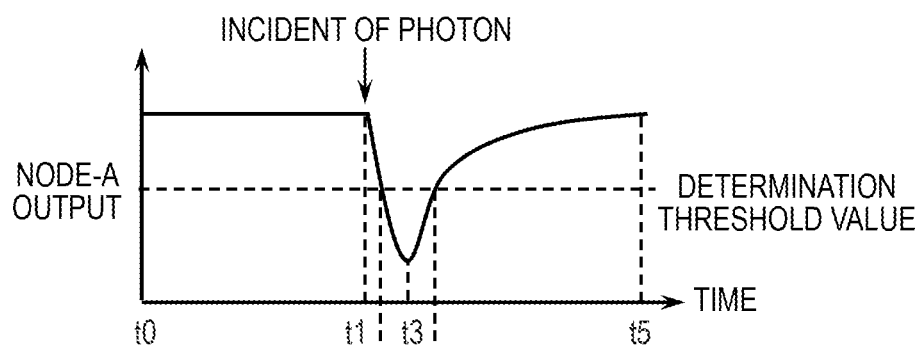
Figure 5C:
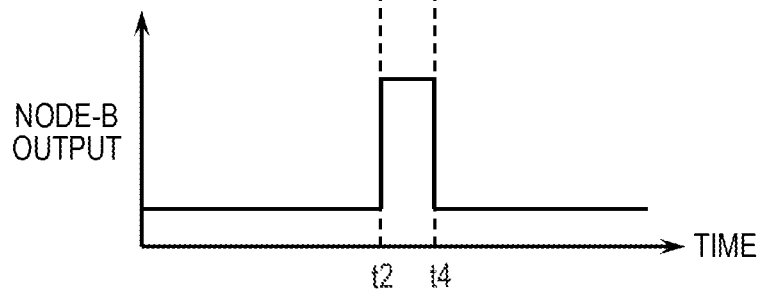

Next, a basic operation of the photoelectric conversion unit of the photoelectric conversion device according to the present embodiment will be described with reference to FIG. 5A to FIG. 5C. FIG. 5A to FIG. 5C are diagrams illustrating the basic operation of the photoelectric conversion unit of the photoelectric conversion device according to the present embodiment. FIG. 5A is a circuit diagram of the photoelectric conversion unit 20 and the waveform shaping circuit 32, FIG. 5B shows a waveform of a signal at an input node (node A) of the waveform shaping circuit 32, and FIG. 5C shows a waveform of a signal at an output node (node B) of the waveform shaping circuit 32.

At time t0, a reverse bias voltage having a potential difference corresponding to (VH−VL) is applied to the photon detection element 22. Although a reverse bias voltage sufficient to cause avalanche multiplication is applied between the anode and the cathode of the APD constituting the photon detection element 22, no carrier is present as a seed of avalanche multiplication in a state where photons are not incident on the photon detection element 22. Therefore, avalanche multiplication does not occur in the photon detection element 22, and no current flows in the photon detection element 22.

At a subsequent time t1, it is assumed that a photon is incident on the photon detection element 22. When photon enters the photon detection element 22, electron-hole pair is generated by photoelectric conversion, and avalanche multiplication occurs using these carriers as seeds, and an avalanche multiplication current flows through the photon detection element 22. When the avalanche multiplication current flows through the quenching element 24, a voltage drop is caused by the quenching element 24, and the voltage of the node A begins to drop. When the voltage drop amount of the node A increases and the avalanche multiplication is stopped at time t3, the voltage level of the node A does not drop further.

When the avalanche multiplication in the photon detection element 22 is stopped, a current that compensates for the voltage drop flows from the node to which the voltage VL is supplied to the node A via the photon detection element 22, and the voltage of the node A gradually increases. Thereafter, at time t5, the node A is settled to the original voltage level.

The waveform shaping circuit 32 binarizes the signal input from the node A in accordance with a predetermined determination threshold value, and outputs the signal from the node B. More specifically, the waveform shaping circuit 32 outputs a low-level signal from the node B when the voltage level of the node A exceeds the determination threshold value, and outputs a high-level signal from the node B when the voltage level of the node A is equal to or lower than the determination threshold. For example, as illustrated in FIG. 5B, it is assumed that the voltage of the node A is equal to or lower than the determination threshold value during a period from time t2 to time t4. In this case, as illustrated in FIG. 5C, the signal level at the node B becomes Low level during the period from time t0 to time t2 and the period from time t4 to time t5, and becomes High level during the period from time t2 to time t4.

Thus, the analog signal input from the node A is shaped into a digital signal by the waveform shaping circuit 32. A pulse signal output from the waveform shaping circuit 32 in response to an incident of photon on the photon detection element 22 is a photon detection pulse signal.

When the processing circuit 34 constitutes a counter, the processing circuit 34 counts the photon detection pulse signal output from the waveform shaping circuit 32 in this manner, and holds the count value as a digital signal. The pixel output circuit 36 outputs the digital signal (pixel signal) held by the processing circuit 34 to the data line 16 in response to a control signal supplied from the horizontal scanning circuit unit 60 via the control line 18.

Figure 6:
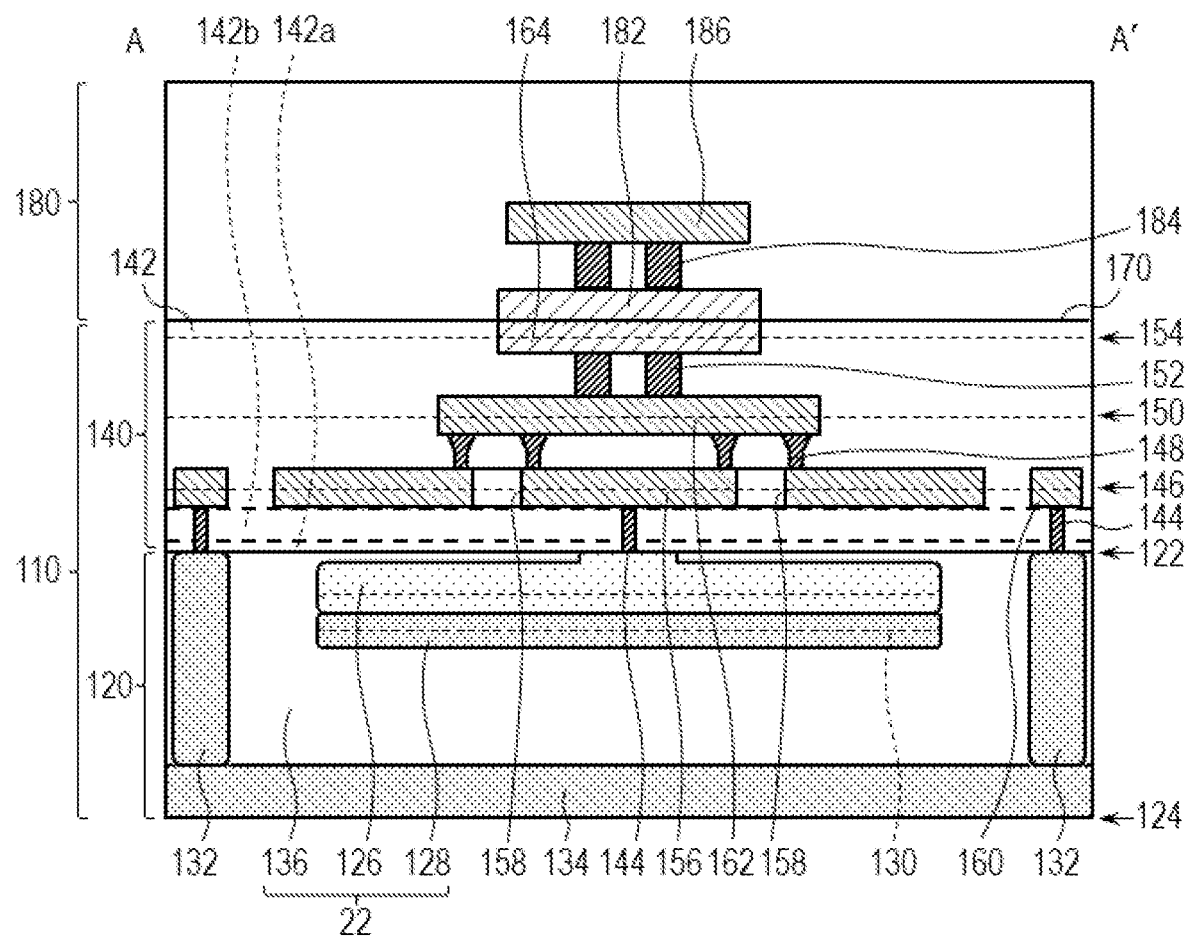
FIG. 6 is a cross-sectional view illustrating a structure of a photon detection element in the photoelectric conversion device according to the first embodiment of the present disclosure.
Figure 7:
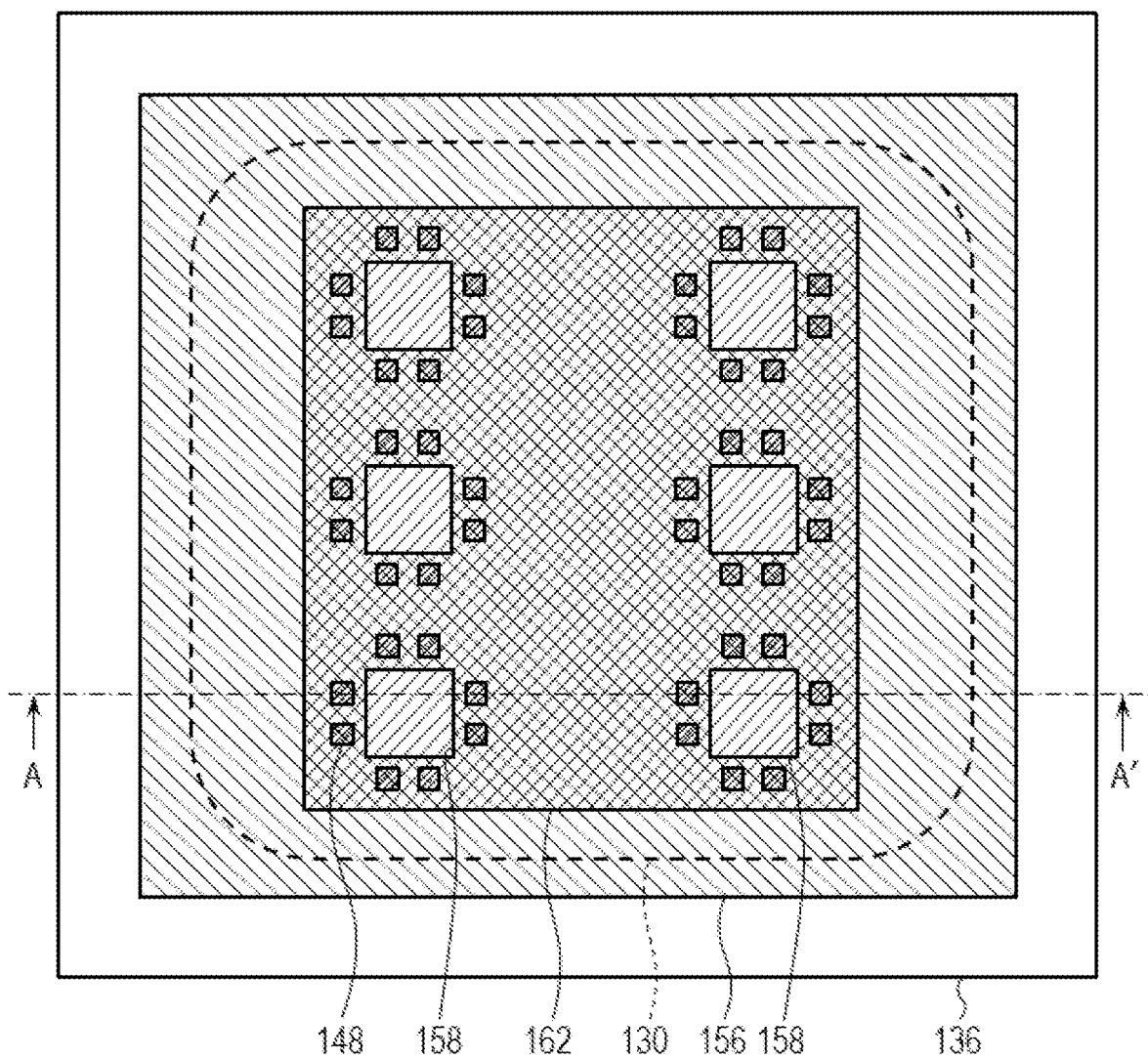
FIG. 7 is a plan view illustrating a structure of the photon detection element in the photoelectric conversion device according to the first embodiment of the present disclosure.

Next, a structure of the photon detection element 22 in the photoelectric conversion device according to the present embodiment will be described with reference to FIG. 6 and FIG. 7. FIG. 6 is a cross-sectional view illustrating the structure of the photon detection element in the photoelectric conversion device according to the present embodiment. FIG. 7 is a plan view illustrating the structure of the photon detection element in the photoelectric conversion device according to the present embodiment. FIG. 6 is a cross-sectional view taken along line A-A' in the plan view of FIG. 7.

As illustrated in FIG. 6, the photoelectric conversion device according to the present embodiment may be configured as a stacked-type photoelectric conversion device in which a sensor substrate 110 and a circuit substrate 180 are stacked.

The sensor substrate 110 includes a semiconductor layer 120 having a first surface 122 and a second surface 124 opposite to the first surface 122, and an interconnection structure layer 140 provided on a side of the first surface 122 of the semiconductor layer 120. A side of the second surface 124 of the semiconductor layer 120 serves as a light receiving surface for receiving light to be detected. That is, the photoelectric conversion device according to the present embodiment is a so-called backside illumination type photoelectric conversion device. An optical structure layer (not illustrated) including a color filter, a microlens, or the like may be provided on the side of the second surface 124 of the semiconductor layer 120.

The semiconductor layer 120 is formed by thinning a single crystalline silicon substrate, and contains n-type impurities or p-type impurities of a predetermined concentration. Here, as an example, the semiconductor layer 120 in which an n-type silicon substrate is thinned is assumed.

An n-type semiconductor region 126 and p-type semiconductor regions 128, 132, and 134 are provided in the semiconductor layer 120. At least a portion of the n-type semiconductor region 126 reaches the first surface 122 of the semiconductor layer 120. The p-type semiconductor region 128 is disposed closer to the second surface 124 than the n-type semiconductor region 126, and forms a p-n junction with the n-type semiconductor region 126. A depletion layer formed between the n-type semiconductor region 126 and the p-type semiconductor region 128 becomes the avalanche multiplication region 130.

A p-type semiconductor region 134 is provided in the side of the second surface 124 of the semiconductor layer 120. The p-type semiconductor region 132 is provided so as to surround a region where the n-type semiconductor region 126 and the p-type semiconductor region 128 are provided in a plan view. The p-type semiconductor region 132 is provided from the first surface 122 of the semiconductor layer 120 to a depth at which the P-type semiconductor region 134 is disposed. A region of the semiconductor layer 120 surrounded by the p-type semiconductor regions 132 and 134 is a region (n-well 136) in which one photon detection element 22 is arranged. Adjacent photon detection elements 22 are electrically isolated from one another by the p-type semiconductor regions 132, 134. The p-type semiconductor region 132 forms an isolation portion for electrically isolating the photon detection elements 22.

The interconnection structure layer 140 includes an insulating layer 142, and interconnection layers 146, 150, and 154 and contact electrodes 144, 148, and 152 disposed in the insulating layer 142. The interconnection layer 146 is an interconnection layer spaced apart from the first surface 122 of the semiconductor layer 120. The interconnection layer 150 is an interconnection layer disposed farther away from the first surface 122 of the semiconductor layer 120 than the interconnection layer 146. The interconnection layer 154 is an interconnection layer disposed farther away from the first surface 122 of the semiconductor layer 120 than the interconnection layer 150. The contact electrode 144 is a conductive member that electrically connects the n-type semiconductor region 126 and the p-type semiconductor region 132 to the interconnection layer 146. The contact electrode 148 is a conductive member for electrically connecting the interconnection layer 146 and the interconnection layer 150. The contact electrode 152 is a conductive member for electrically connecting the interconnection layer 150 and the interconnection layer 154.

The interconnection layer 146 includes an interconnection 156 electrically connected to the n-type semiconductor region 126 via the contact electrode 144, and an interconnection 160 electrically connected to the p-type semiconductor region 132 via the contact electrode 144. The contact electrode 144 connecting the n-type semiconductor region 126 and the interconnection 156 is connected to the n-type semiconductor region 126 at a portion where the n-type semiconductor region 126 reaches the first surface 122 of the semiconductor layer 120. The interconnection layer 150 includes an interconnection 162 electrically connected to the interconnection 156 via the contact electrodes 148. The interconnection layer 154 includes a pad electrode 164 electrically connected to the interconnection 162 via the contact electrode 152.

Although FIG. 6 illustrates the interconnection structure layer 140 including three interconnection layers 146, 150, and 154, the number of interconnection layers constituting the interconnection structure layer 140 is not particularly limited. For example, one or more interconnection layers may be further provided between the interconnection layer 150 and the interconnection layer 154. In this case, the interconnection 162 and the pad electrode 164 may be electrically connected through these interconnection layers.

In the photoelectric conversion device according to the present embodiment, the insulating film constituting the insulating layer 142 includes, for example, an $SiO_2$ film. As illustrated in FIG. 6, an insulating film 142a as an antireflection layer and an insulating film 142b having a refractive index lower than that of the insulating film 142a may be provided between the semiconductor layer 120 and the interconnection layer 146 from the side of the semiconductor layer 120. The insulating film 142a is not particularly limited, but may be, for example, an SiN film or a laminate of an SiN film and an $SiO_2$ film. By providing the insulating film 142a, the light re-entered on the first surface 122 from the interconnection 156 is refracted at the interface between these insulating films and is further incident on the side of the photon detection element 22. Accordingly, together with the configurations of the interconnections 156 and 162 and the contact electrodes 148 described in the present embodiment, photons incident on the opening 158 may be reflected at an angle closer to the vertical direction and incident on the photon detection element 22. Thus, the photon detection efficiency of the photon detection element 22 may be further improved.

The circuit substrate 180 is stacked on the sensor substrate 110 on the side of the interconnection structure layer 140. A bonding surface 170 is a bonding portion between the sensor substrate 110 and the circuit substrate 180. The circuit substrate 180 includes a semiconductor layer provided with elements such as transistors, and an interconnection structure layer provided on the semiconductor layer. In FIG. 6, for simplification of the drawing, only the pad electrode 182 formed of the uppermost interconnection layer, the interconnection 186 formed of the interconnection layer below the pad electrode 182, and the contact electrode 184 connecting them are illustrated out of the semiconductor layer and the interconnection structure layer constituting the circuit substrate 180.

The pad electrode 164 of the sensor substrate 110 and the pad electrode 182 of the circuit substrate 180 are made of a metal material such as copper (Cu). Thus, the sensor substrate 110 and the circuit substrate 180 are electrically and mechanically coupled by metal-metal bonding between the metal material constituting the pad electrode 164 and the metal material constituting the pad electrode 182.

A negative voltage (voltage VL) is supplied to the n-type semiconductor region 126 from the circuit substrate 180 via the contact electrode 144, the interconnection 156, the contact electrodes 148, the interconnection 162, the contact electrodes 152, the pad electrodes 164 and 182, the contact electrode 184, the interconnection 186, and the like. A positive voltage (voltage VH) is supplied to the p-type semiconductor regions 132 and 134 from the circuit substrate 180 via the contact electrode 144, the interconnection 160, and the like. Accordingly, a reverse bias voltage sufficient to perform the avalanche multiplication operation is applied between the n-type semiconductor region 126 and the p-type semiconductor region 128, and the avalanche multiplication region 130 is formed. Electrons generated by photons incident on the photon detection element 22 are multiplied by the high electric field formed in the avalanche multiplication region 130.

The interconnection 156, the contact electrodes 148, and the interconnection 162 are interconnection structures that serve as an electrical path for supplying the voltage VL to the n-type semiconductor region 126. The interconnection structure also functions as a reflecting member for reflecting the light transmitted through the semiconductor layer 120 and causing the light to enter the photon detection element 22 again. For this purpose, for example, as illustrated in FIG. 7, the interconnection 156 and the interconnection 162 are arranged such that the entire avalanche multiplication region 130 overlaps at least one of the interconnection 156 and the interconnection 162 in a plan view. The avalanche multiplication region 130 is arranged inside the outer periphery of the interconnection 156 in the plan view. The interconnection 156 is provided with openings 158 in portions overlapping the avalanche multiplication region 130 in the plan view, and the interconnection 162 is arranged so as to overlap the entire openings 158 in the plan view. That is, the interconnection structure including the interconnection 156 and the interconnection 162 as a whole is arranged so as to overlap the entire avalanche multiplication region 130 in the plan view. The contact electrodes 148 are arranged around the openings 158 in the plan view.

Of the light incident from the second surface 124, the light transmitted through the photon detection element 22 (semiconductor layer 120) is reflected by the surface of the interconnection 156, or passes through the openings 158 and is reflected by the surfaces of the interconnection 162 and the contact electrodes 148, and enters the photon detection element 22 again. Therefore, by arranging the entire avalanche multiplication region 130 so as to overlap at least one of the interconnection 156 and the interconnection 162 in the plan view, the photon detection efficiency by the photon detection element 22 may be enhanced.

The openings 158 are provided in the interconnection 156 in order to increase the incidence efficiency of reflected photons on the photon detection element 22. That is, when light is reflected, compared to the structure of only the interconnection 156 having no openings, the openings 158, the contact electrodes 148, and the interconnection 162 are provided, which is equivalent to a state in which a concave portion is formed on the surface of the interconnection 156 on the side of the semiconductor layer 120. Thus, the photons incident in the openings 158 are reflected at an angle closer to the parallel direction, and the optical path length of the photon detection element 22 becomes long, so that the ratio of the photons incident on the photon detection element 22 may be increased.

The contact electrodes 148 for electrically connecting the interconnection 156 and the interconnection 162 are arranged so as to surround each of the openings 158 in the plan view, for example, as illustrated in FIG. 7. In this case, the plurality of contact electrodes 148 surrounding one opening 158 is preferably arranged at intervals shorter than the length corresponding to the wavelength of light with which the photon detection element 22 has sensitivity. With this configuration, light incident in the opening 158 may be prevented from leaking out of the gap between the contact electrodes 148. For example, as illustrated in FIG. 6, it is desirable that the contact electrode 148 has a tapered shape whose width in a cross-sectional view is narrower on the side of the interconnection 156 than on the side of the interconnection 162.

Although FIG. 7 illustrates the openings 158 having a quadrangular shape in the plan view, the shape of the openings 158 is not particularly limited, and may be, for example, a polygon other than a quadrangular shape, a circle, an ellipse, or the like. When the openings 158 have a polygonal shape, it is desirable that at least one contact electrode 148 be arranged corresponding to each side of the polygonal shape.

When a plurality of openings 158 are provided in the interconnection 156, these openings 158 are preferably arranged at intervals of 1 μm or less. Although FIG. 7 illustrates an example in which the openings 158 are arranged in a simple grid pattern, the arrangement of the openings 158 is not limited thereto, and for example, the openings 158 may be arranged in a staggered grid pattern.

The materials constituting the interconnections 156 and 162 and the contact electrodes 148 are made of a material having high reflectivity with respect to light to be detected. For example, a metal material such as copper (Cu), aluminum (Al), or tungsten (W), an alloy material containing at least one of these, or the like may be used as a material for forming the interconnections 156 and 162 and the contact electrodes 148.

As described above, according to the present embodiment, the light receiving sensitivity of the photoelectric conversion device may be effectively improved.

Second Embodiment

Figure 8:
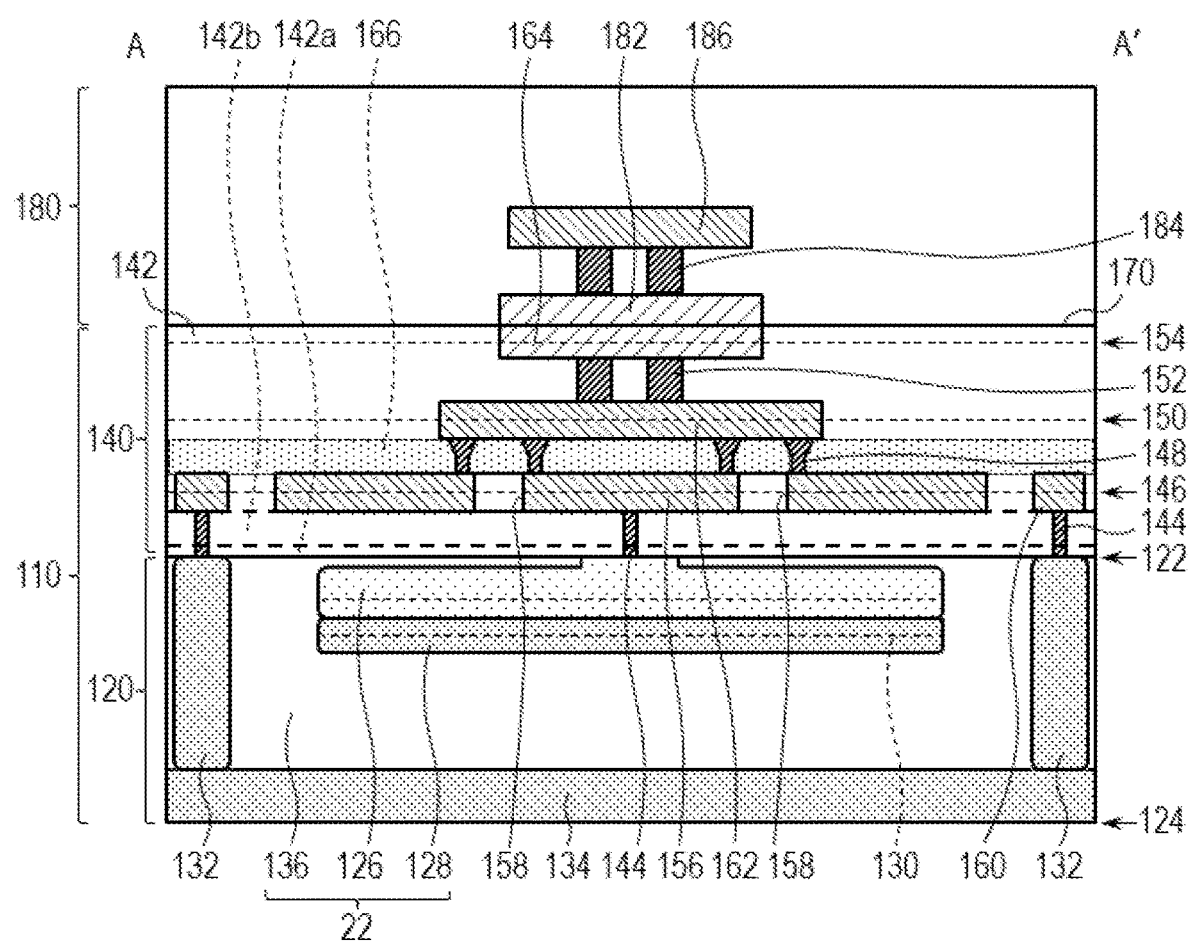
FIG. 8 is a cross-sectional view illustrating a structure of a photon detection element in a photoelectric conversion device according to a second embodiment of the present disclosure.

A photoelectric conversion device according to a second embodiment of the present disclosure will be described with reference to FIG. 8. The same components as those of the photoelectric conversion device according to the first embodiment are denoted by the same reference numerals, and the description thereof will be omitted or simplified. FIG. 8 is a cross-sectional view illustrating a structure of a photon detection element in the photoelectric conversion device according to the present embodiment.

In the photoelectric conversion device according to the present embodiment, of the insulating films constituting the insulating layer 142, the insulating film 166 provided between the interconnection 156 and the interconnection 162 has a higher refractive index than the insulating film provided between the semiconductor layer 120 and the insulating film 166. The insulating film 166 between the interconnection 156 and the interconnection 162 is not particularly limited, but may be, for example, an SiON film. The insulating film between the semiconductor layer 120 and the insulating film 166 is not particularly limited, but may be, for example, an $SiO_2$ film. Other points are the same as those of the photoelectric conversion device according to the first embodiment.

When the insulating film 166 provided between the interconnection 156 and the interconnection 162 is formed of a material having a refractive index higher than that of the insulating film provided between the semiconductor layer 120 and the insulating film 166, light passing through the interface between these insulating films is refracted. Therefore, in combination with the configurations of the interconnections 156 and 162 and the contact electrodes 148 described in the first embodiment, photons incident in the openings 158 are reflected at an angle closer to the parallel direction, and the optical path length in the photon detection element 22 becomes long. Thus, the photon detection efficiency of the photon detection element 22 may be further improved.

As described above, according to the present embodiment, the light receiving sensitivity of the photoelectric conversion device may be effectively improved.

Third Embodiment

Figure 9:
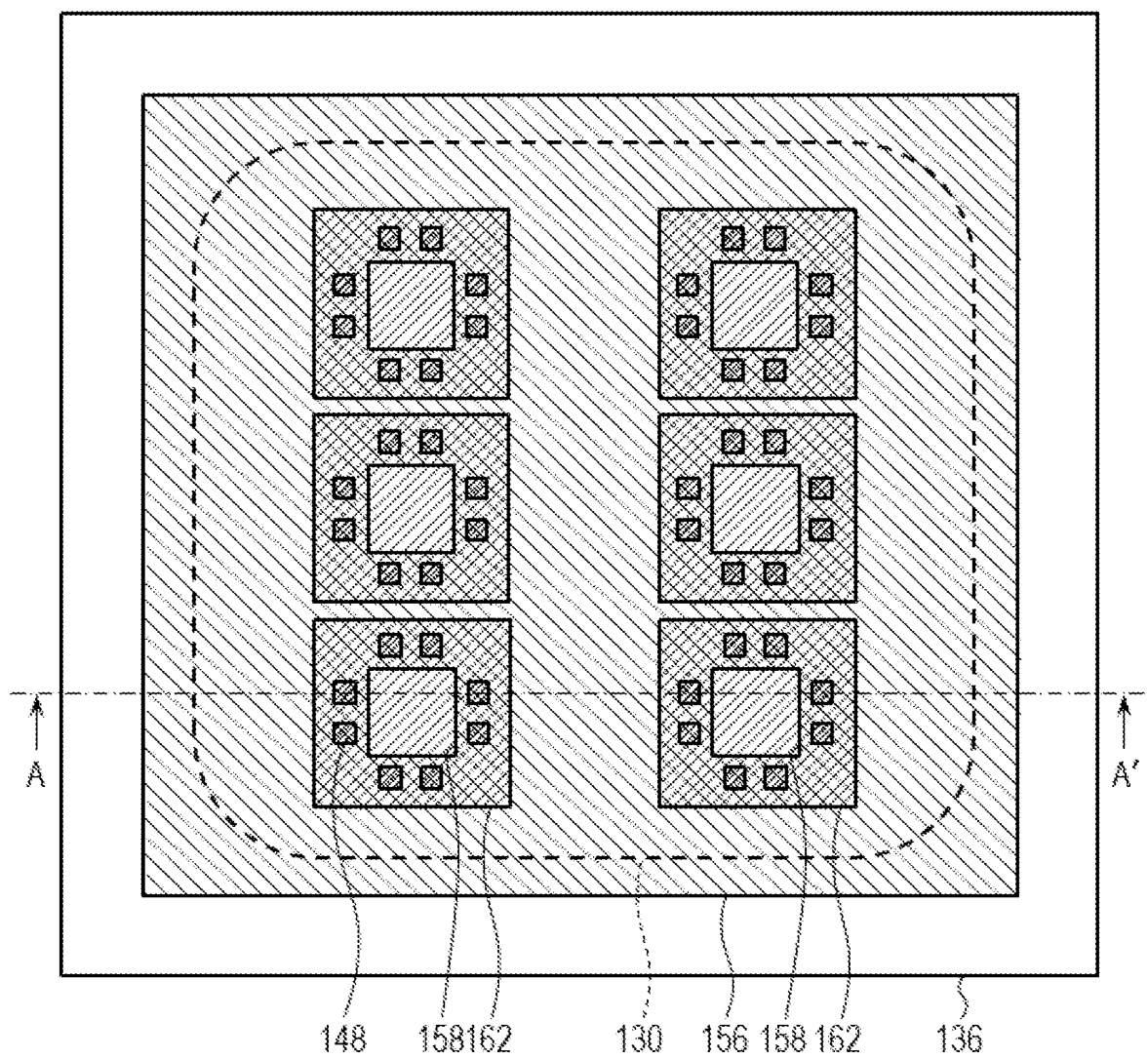
FIG. 9 is a plan view illustrating a structure of a photon detection element in a photoelectric conversion device according to a third embodiment of the present disclosure.

A photoelectric conversion device according to a third embodiment of the present disclosure will be described with reference to FIG. 9. The same components as those of the photoelectric conversion device according to the first and second embodiments are denoted by the same reference numerals, and the description thereof will be omitted or simplified. FIG. 9 is a plan view illustrating a structure of a photon detection element in the photoelectric conversion device according to the present embodiment.

In the first embodiment, the planar pattern of the interconnection 162 is designed such that the plurality of openings 158 provided in the interconnection 156 are covered by one continuous interconnection 162, but the planar pattern of the interconnection 162 is not limited to this.

The plurality of openings 158 provided in the interconnection 156 may be configured to be covered with a plurality of interconnections 162 corresponding to each of the openings 158, for example, as illustrated in FIG. 9. Alternatively, a plurality of interconnections 162 each covering a plurality of openings 158 may be provided for one interconnection 156. The plurality of interconnections 162 corresponding to one interconnection 156 may be electrically connected to each other by an upper-layer interconnection (e.g., the pad electrode 164) or an interconnection in the circuit substrate 180.

According to the configuration of the present embodiment, the same effect as that of the photoelectric conversion device according to the first embodiment may be realized.

Fourth Embodiment

Figure 10:
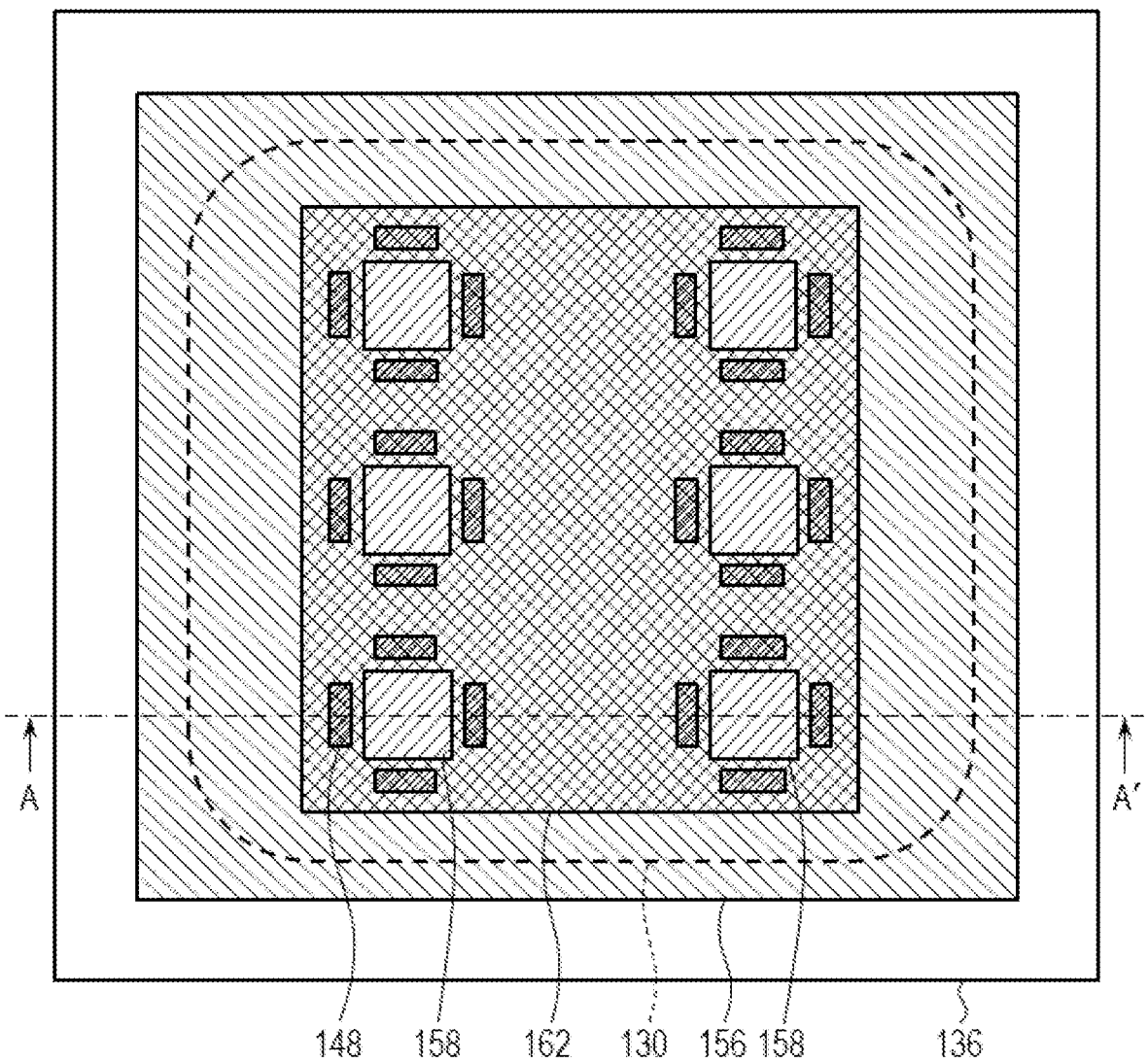
FIG. 10 and FIG. 11 are plan views illustrating a structure of a photon detection element in a photoelectric conversion device according to a fourth embodiment of the present disclosure.
Figure 11:
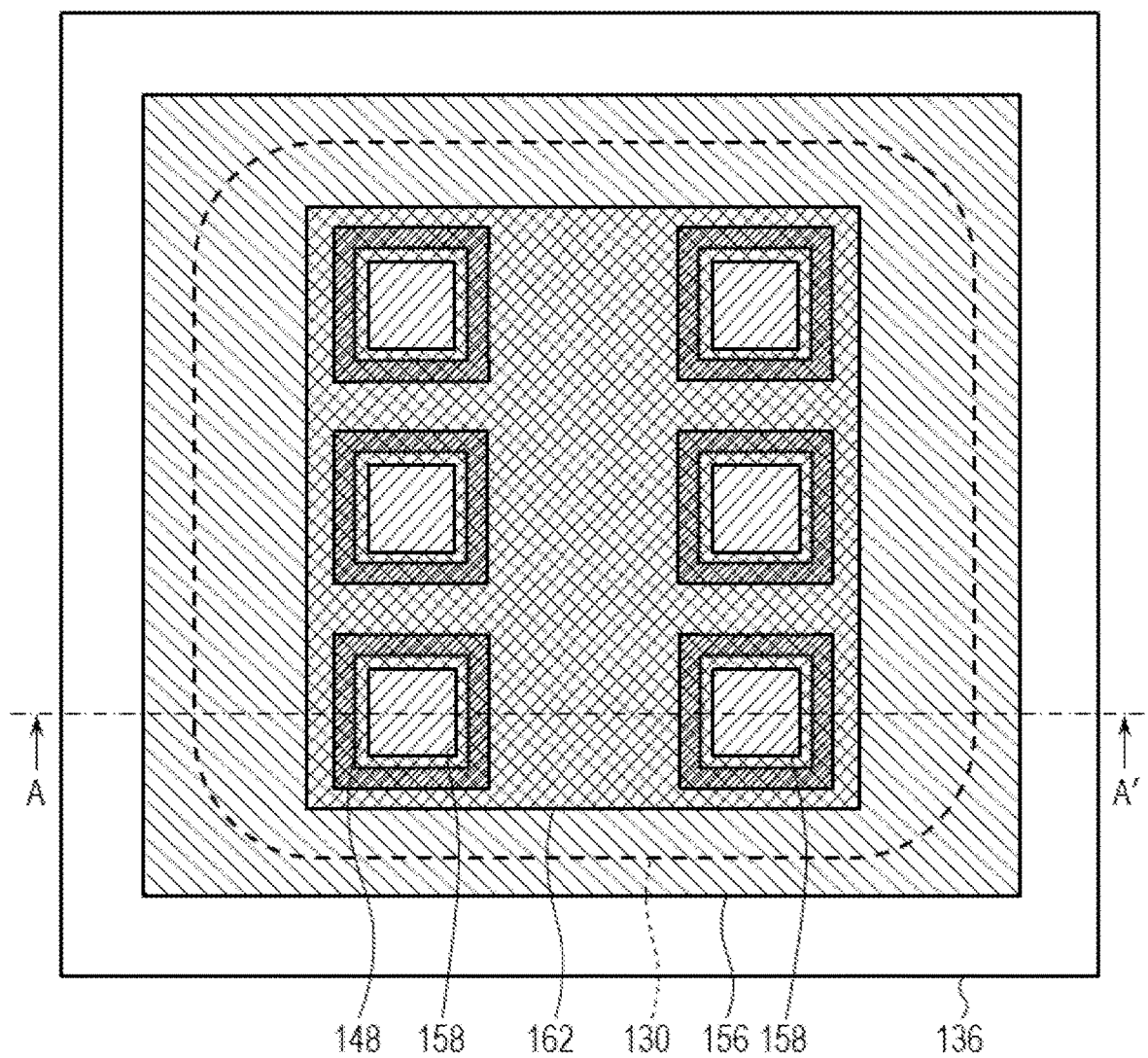

A photoelectric conversion device according to a fourth embodiment of the present disclosure will be described with reference to FIG. 10 and FIG. 11. The same components as those of the photoelectric conversion device according to the first to third embodiments are denoted by the same reference numerals, and the description thereof will be omitted or simplified. FIG. 10 and FIG. 11 are plan views illustrating the structure of the photon detection element in the photoelectric conversion device according to the present embodiment.

In the first to third embodiments, a plurality of contact electrodes 148 are arranged so as to surround the opening 158, and the interconnection 156 and the interconnection 162 are electrically connected by the contact electrodes 148, but the shape and arrangement of the contact electrodes 148 are not limited thereto.

For example, as illustrated in FIG. 10, the contact electrodes 148 may be a rectangular pattern along each side of the openings 158 in a plan view. Alternatively, as illustrated in FIG. 11, the contact electrode 148 may be a frame-like pattern surrounding the opening 158 in a plan view.

According to the configuration of the present embodiment, the same effect as that of the photoelectric conversion device according to the first embodiment may be realized.

Fifth Embodiment

Figure 12:
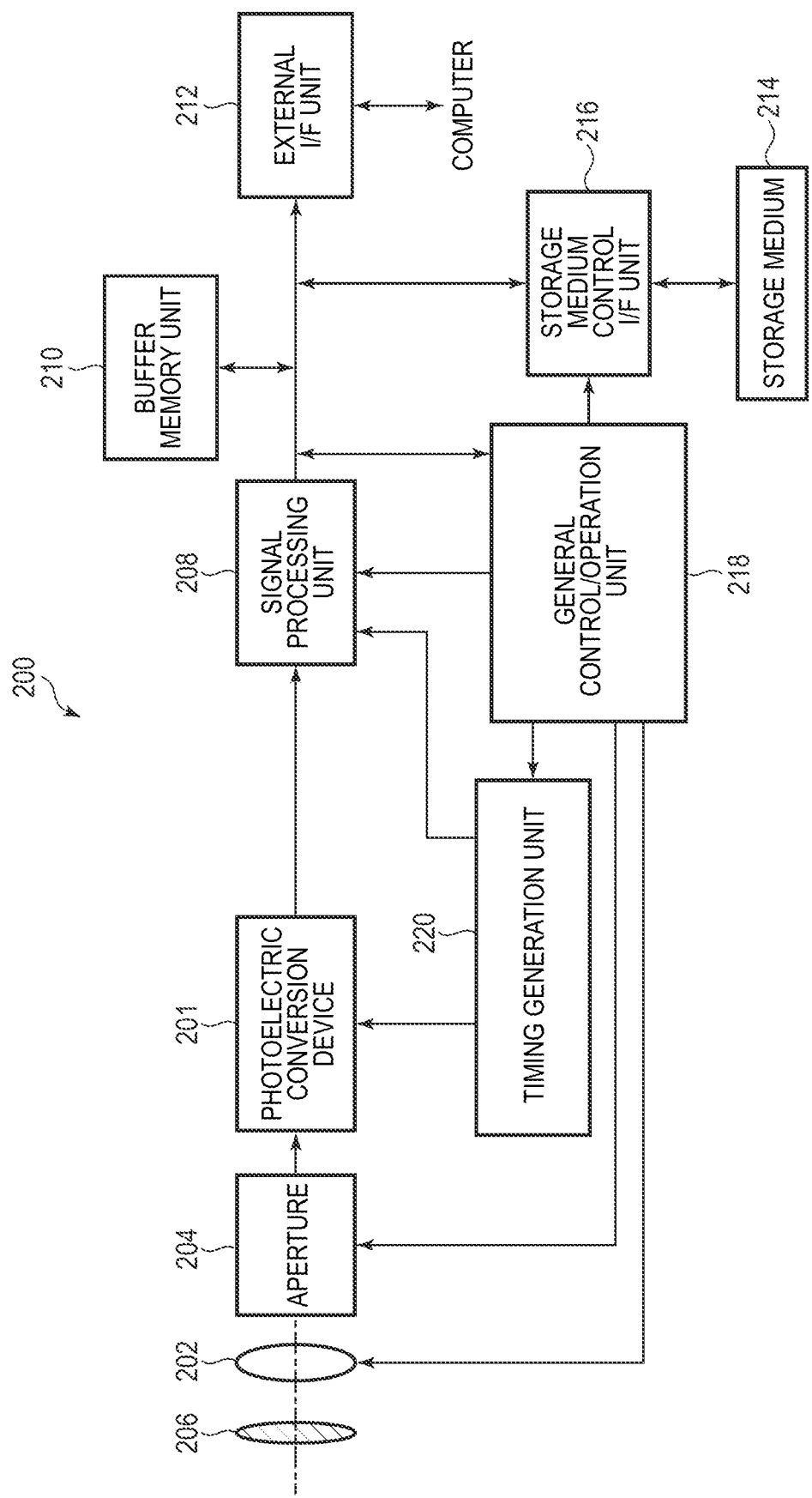
FIG. 12 is a block diagram illustrating a schematic configuration of a photodetection system according to a fifth embodiment of the present disclosure.

A photodetection system according to a fifth embodiment of the present disclosure will be described with reference to FIG. 12. FIG. 12 is a block diagram illustrating a schematic configuration of the photodetection system according to the present embodiment. In the present embodiment, a photodetection sensor to which the photoelectric conversion device 100 of the first to fourth embodiments is applied will be described.

The photoelectric conversion device 100 described in the first to fourth embodiments is applicable to various photodetection systems. Examples of applicable photodetection systems include imaging systems such as digital still cameras, digital camcorders, surveillance cameras, copiers, facsimiles, cellular phones, in-vehicle cameras, and observation satellites. A camera module including an optical system such as a lens and an imaging device is also included in the photodetection system. FIG. 12 is a block diagram of a digital still camera.

The photodetection system 200 illustrated in FIG. 12 includes a photoelectric conversion device 201, a lens 202 for forming an optical image of an object on the photoelectric conversion device 201, an aperture 204 for varying the amount of light passing through the lens 202, and a barrier 206 for protecting the lens 202. The lens 202 and the aperture 204 are optical systems for focusing light on the photoelectric conversion device 201. The photoelectric conversion device 201 is the photoelectric conversion device 100 described in the first to fourth embodiments, and converts an optical image formed by the lens 202 into image data.

The photodetection system 200 also includes a signal processing unit 208 that processes an output signal output from the photoelectric conversion device 201. The signal processing unit 208 generates image data from the digital signal output from the photoelectric conversion device 201. The signal processing unit 208 performs various types of correction and compression as necessary to output image data. The photoelectric conversion device 201 may include an AD conversion unit that generates a digital signal to be processed by the signal processing unit 208. The AD conversion unit may be formed on a semiconductor layer (semiconductor substrate) on which the photon detection element of the photoelectric conversion device 201 is formed, or may be formed on a semiconductor substrate different from the semiconductor layer on which the photon detection element of the photoelectric conversion device 201 is formed. The signal processing unit 208 may be formed on the same semiconductor substrate as the photoelectric conversion device 201.

The photodetection system 200 further includes a buffer memory unit 210 for temporarily storing image data, and an external interface unit (external I/F unit) 212 for communicating with an external computer or the like. The photodetection system 200 further includes a storage medium 214 such as a semiconductor memory for storing or reading out image data, and a storage medium control interface unit (storage medium control I/F unit) 216 for recording or reading out image data on or from the storage medium 214. The storage medium 214 may be built in the photodetection system 200 or may be detachable. Communication between the storage medium control I/F unit 216 and the storage medium 214 and communication from the external I/F unit 212 may be performed wirelessly.

The photodetection system 200 further includes a general control/operation unit 218 that controls various calculations and the entire digital still camera, and a timing generation unit 220 that outputs various timing signals to the photoelectric conversion device 201 and the signal processing unit 208. Here, the timing signal or the like may be input from the outside, and the photodetection system 200 may include at least the photoelectric conversion device 201 and the signal processing unit 208 that processes the output signal output from the photoelectric conversion device 201. The timing generation unit 220 may be mounted on the photoelectric conversion device 201. The general control/operation unit 218 and the timing generation unit 220 may be configured to perform part or all of the control functions of the photoelectric conversion device 201.

The photoelectric conversion device 201 outputs an imaging signal to the signal processing unit 208. The signal processing unit 208 performs predetermined signal processing on the imaging signal output from the photoelectric conversion device 201, and outputs image data. The signal processing unit 208 generates an image using the imaging signal. The signal processing unit 208 may be configured to perform distance measurement calculation on a signal output from the photoelectric conversion device 201.

As described above, according to the present embodiment, by configuring the photodetection system using the photoelectric conversion devices of the first to fourth embodiments, it is possible to realize a photodetection system capable of acquiring images of higher quality.

Sixth Embodiment

Figure 13:
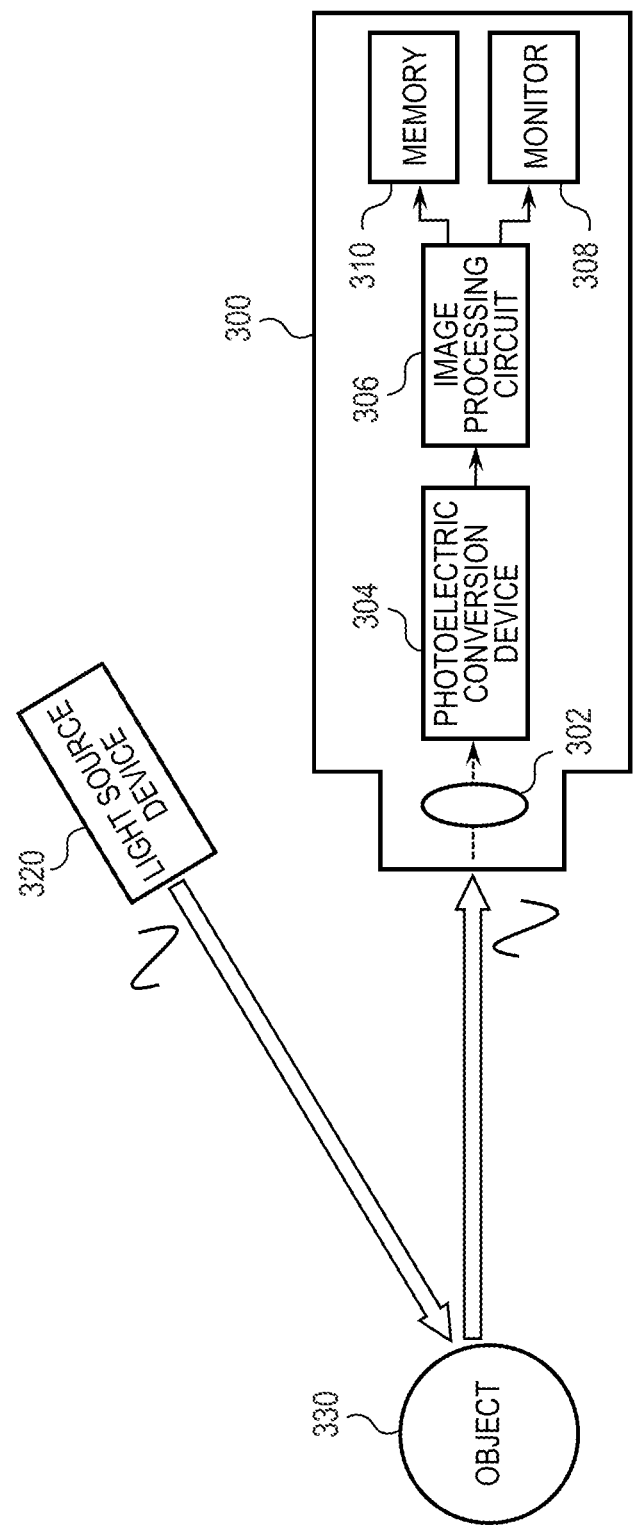
FIG. 13 is a block diagram illustrating a schematic configuration of a photodetection system according to a sixth embodiment of the present disclosure.

A photodetection system according to a sixth embodiment of the present disclosure will be described with reference to FIG. 13. FIG. 13 is a block diagram illustrating a schematic configuration of a range image sensor which is an example of the photodetection system according to the present embodiment. In this embodiment, a range image sensor will be described as an example of a photodetection system to which the photoelectric conversion device 100 according to the first to fourth embodiments is applied.

As illustrated in FIG. 13, the range image sensor 300 according to the present embodiment may include an optical system 302, a photoelectric conversion device 304, an image processing circuit 306, a monitor 308, and a memory 310. The range image sensor 300 receives light (modulated light or pulsed light) emitted from the light source device 320 toward an object 330 and reflected by the surface of the object 330, and acquires a distance image corresponding to the distance to the object 330.

The optical system 302 includes one or a plurality of lenses, and has a role of forming an image of image light (incident light) from the object 330 on a light receiving surface (sensor unit) of the photoelectric conversion device 304.

The photoelectric conversion device 304 is the photoelectric conversion device 100 described in the first to fourth embodiments, and has a function of generating a distance signal indicating a distance to the object 330 based on image light from the object 330 and supplying the generated distance signal to the image processing circuit 306.

The image processing circuit 306 has a function of performing image processing for constructing a distance image based on the distance signal supplied from the photoelectric conversion device 304.

The monitor 308 has a function of displaying a distance image (image data) obtained by image processing in the image processing circuit 306. The memory 310 has a function of storing (recording) a distance image (image data) obtained by image processing in the image processing circuit 306.

As described above, according to the present embodiment, by configuring the range image sensor using the photoelectric conversion devices of the first to fourth embodiments, it is possible to realize a range image sensor capable of acquiring a distance image including more accurate distance information together with improvement in characteristics of the pixel 12.

Seventh Embodiment

Figure 14:
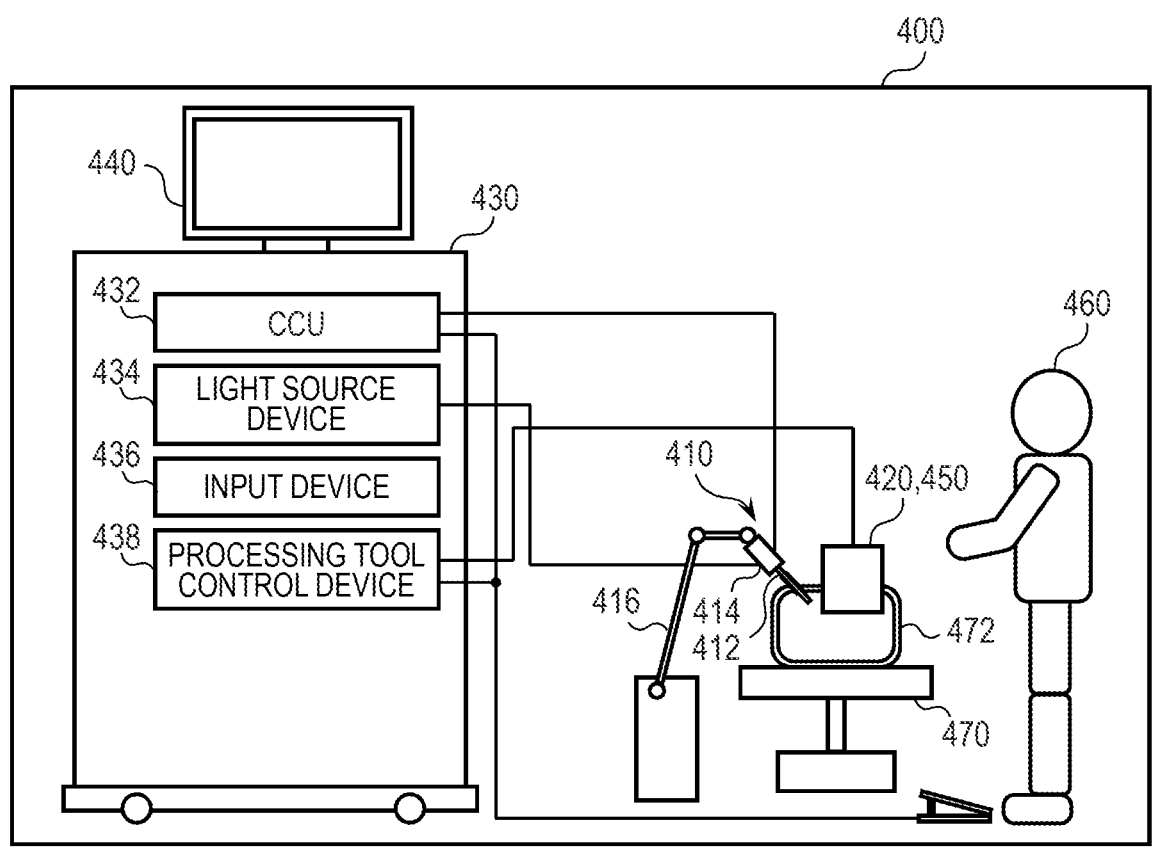
FIG. 14 is a schematic diagram illustrating a configuration example of a photodetection system according to a seventh embodiment of the present disclosure.

A photodetection system according to a seventh embodiment of the present disclosure will be described with reference to FIG. 14. FIG. 14 is a schematic diagram illustrating a configuration example of an endoscope surgical system which is an example of the photodetection system according to the present embodiment. In the present embodiment, an endoscopic surgical system will be described as an example of a photodetection system to which the photoelectric conversion device 100 of the first to fourth embodiments is applied.

FIG. 14 illustrates a state in which an operator (surgeon) 460 performs an operation on a patient 472 on a patient bed 470 using an endoscopic surgical system 400.

As illustrated in FIG. 14, the endoscopic surgical system 400 according to the present embodiment may include an endoscope 410, a surgical tool 420, and a cart 430 on which various devices for endoscopic surgery are mounted. The cart 430 may include a CCU (Camera Control Unit) 432, a light source device 434, an input device 436, a processing tool control device 438, a display device 440, and the like.

The endoscope 410 includes a lens barrel 412 in which a region of a predetermined length from the tip is inserted into the body cavity of the patient 472, and a camera head 414 connected to the base end of the lens barrel 412. Although FIG. 14 illustrates the endoscope 410 configured as a so-called rigid mirror having a rigid lens barrel 412, the endoscope 410 may be configured as a so-called flexible mirror having a flexible lens barrel. The endoscope 410 is movably held by an arm 416.

An opening into which an objective lens is fitted is provided at the tip of the lens barrel 412. A light source device 434 is connected to the endoscope 410, and light generated by the light source device 434 is guided to the tip of the lens barrel 412 by a light guide extended inside the lens barrel 412, and is irradiated toward an observation target in the body cavity of the patient 472 via the objective lens. The endoscope 410 may be a direct-view mirror, a perspective mirror, or a side-view mirror.

An optical system and a photoelectric conversion device (not illustrated) are provided inside the camera head 414, and reflected light (observation light) from an observation target is focused on the photoelectric conversion device by the optical system. The photoelectric conversion device photoelectrically converts the observation light and generates an electric signal corresponding to the observation light, that is, an image signal corresponding to the observation image. As the photoelectric conversion device, the photoelectric conversion device 100 described in the first to fourth embodiments may be used. The image signal is transmitted to the CCU 432 as raw data.

The CCU 432 is configured by a CPU (central processing unit), a GPU (graphics processing unit), or the like, and controls overall operations of the endoscope 410 and the display device 440. Further, the CCU 432 receives an image signal from the camera head 414, and performs various kinds of image processing for displaying an image based on the image signal, such as development processing (demosaic processing).

The display device 440 displays an image based on the image signal subjected to the image processing by the CCU 432 under the control of the CCU 432.

The light source device 434 is constituted by, for example, a light source such as an LED (Light Emitting Diode), and supplies irradiation light to the endoscope 410 when capturing an image of a surgical part or the like.

The input device 436 is an input interface to the endoscopic surgical system 400. The user may input various kinds of information and input instructions to the endoscopic surgical system 400 via the input device 436.

The processing tool control device 438 controls the actuation of the energy processing tool 450 for tissue ablation, incision, blood vessel sealing, etc.

The light source device 434 for supplying irradiation light to the endoscope 410 when capturing an image of the surgical portion may be constituted by a white light source constituted by, for example, an LED, a laser light source, or a combination thereof. When a white light source is configured by a combination of RGB laser light sources, the output intensity and the output timing of each color (each wavelength) may be controlled with high accuracy, so that the white balance of the captured image may be adjusted in the light source device 434. In this case, it is also possible to capture an image corresponding to each of RGB in a time-division manner by irradiating the observation target with laser light from each of the RGB laser light sources in a time-division manner and controlling driving of the imaging device of the camera head 414 in synchronization with the irradiation timing. According to this method, a color image may be obtained without providing a color filter in the imaging device.

Further, the driving of the light source device 434 may be controlled so as to change the intensity of the output light at predetermined time intervals. By controlling the driving of the imaging device of the camera head 414 in synchronization with the timing of changing the intensity of the light to acquire an image in a time-division manner, and by synthesizing the image, it is possible to generate an image in a high dynamic range without so-called blocked up shadows and blown out highlights.

The light source device 434 may be configured to be able to supply light in a predetermined wavelength band corresponding to special light observation. In special light observation, for example, wavelength dependence of light absorption in body tissue is used. Specifically, a predetermined tissue such as a blood vessel in the surface layer of the mucosa is imaged with high contrast by irradiating light in a narrow band compared to the irradiation light (i.e., white light) during normal observation. Alternatively, in special light observation, fluorescence observation for obtaining an image by fluorescence generated by irradiation with excitation light may be performed. In the fluorescence observation, excitation light may be irradiated to the body tissue to observe fluorescence from the body tissue, or a reagent such as indocyanine green (ICG) may be locally poured into the body tissue and the body tissue may be irradiated with excitation light corresponding to the fluorescence wavelength of the reagent to obtain a fluorescence image. The light source device 434 may be configured to be able to supply narrowband light and/or excitation light corresponding to such special light observation.

As described above, according to the present embodiment, by configuring the endoscopic surgical system using the photoelectric conversion devices of the first to fourth embodiments, it is possible to realize an endoscopic surgical system capable of acquiring images of higher quality.

Eighth Embodiment

Figure 15A:
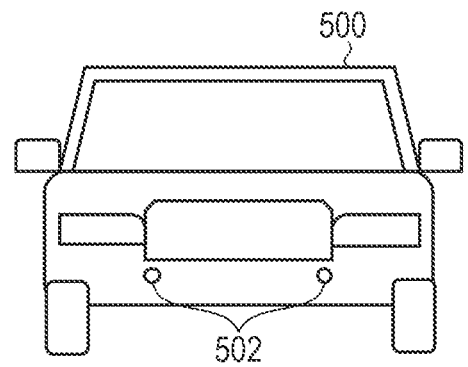
FIG. 15A, FIG. 15B, and FIG. 15C are schematic diagrams illustrating a configuration example of a movable object according to an eighth embodiment of the present disclosure.
Figure 15B:
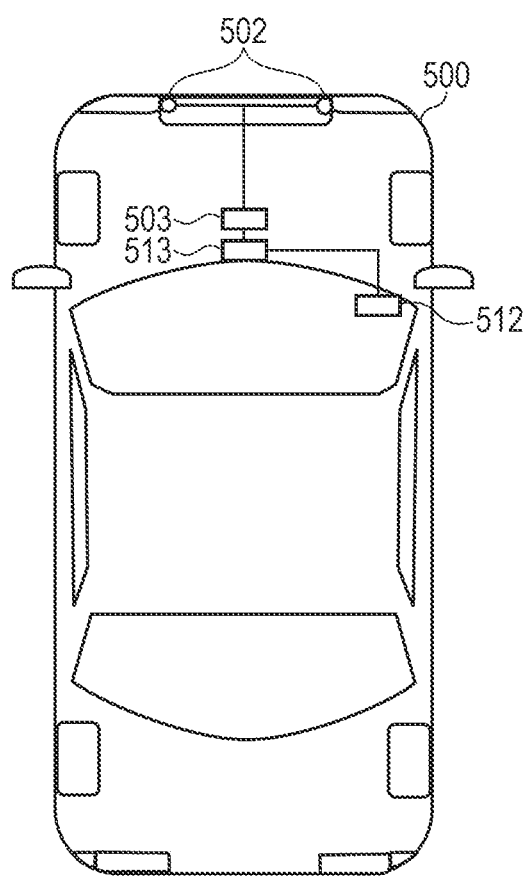
Figure 15C:
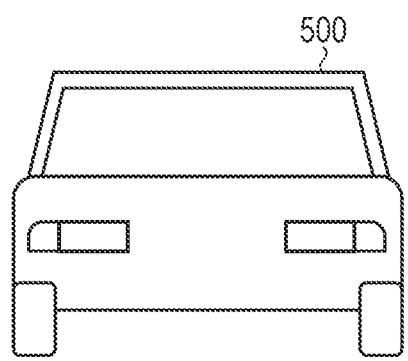
Figure 16:
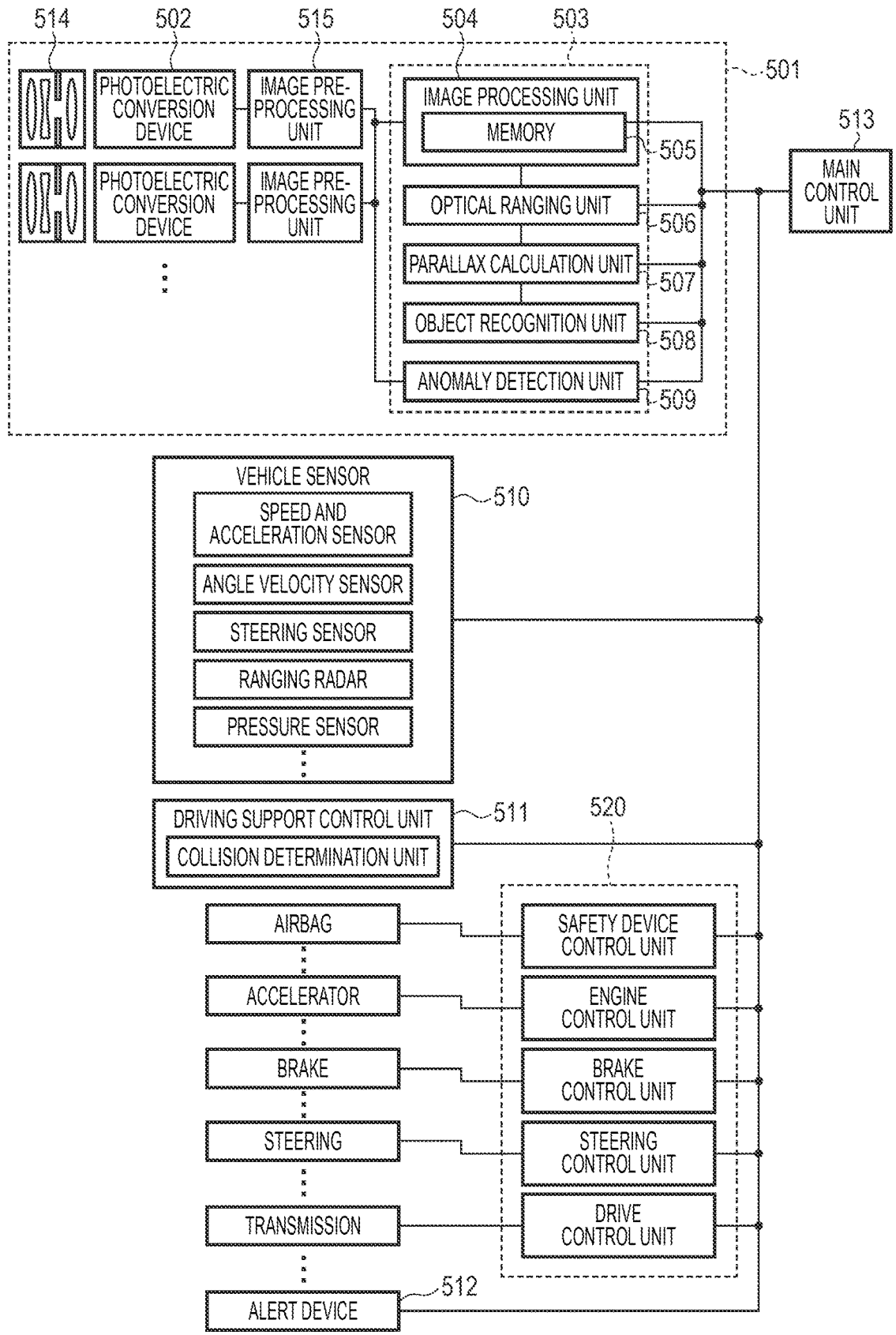
FIG. 16 is a block diagram illustrating a schematic configuration of a photodetection system according to an eighth embodiment of the present disclosure.
Figure 17:
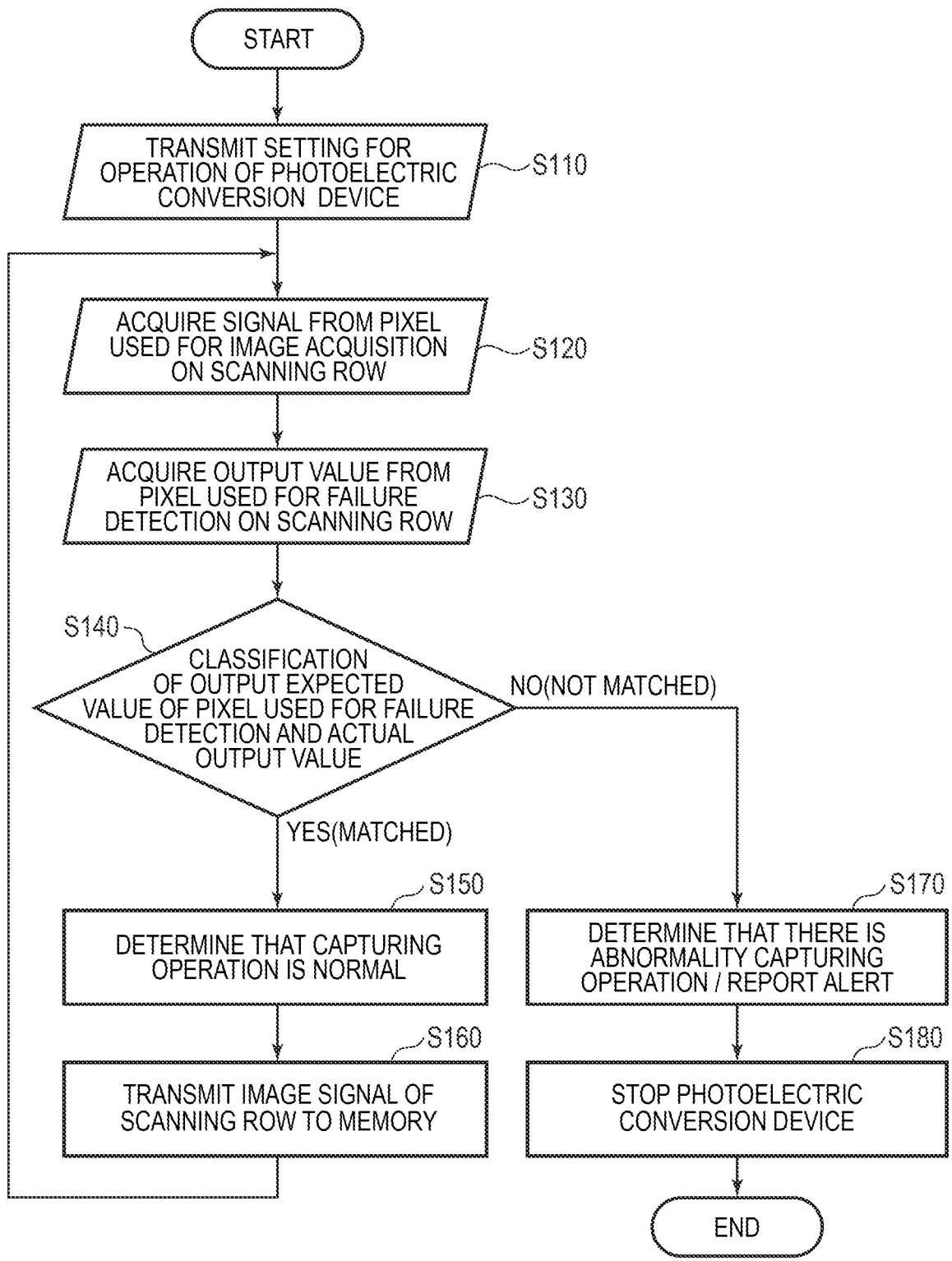
FIG. 17 is a flowchart illustrating an operation of the photodetection system according to the eighth embodiment of the present disclosure.

A photodetection system and a movable object according to an eighth embodiment of the present disclosure will be described with reference to FIG. 15A to FIG. 17. FIG. 15A to FIG. 15C are schematic diagrams illustrating a configuration example of a movable object according to the present embodiment. FIG. 16 is a block diagram illustrating a schematic configuration of the photodetection system according to the present embodiment. FIG. 17 is a flowchart illustrating the operation of the photodetection system according to the present embodiment. In the present embodiment, an application example to an in-vehicle camera will be described as a photodetection system to which the photoelectric conversion device 100 according to the first to fourth embodiments is applied.

FIG. 15A to FIG. 15C are schematic diagrams illustrating a configuration example of a movable object (a vehicle system) according to the present embodiment. FIG. 15A to FIG. 15C illustrates a configuration of a vehicle 500 (an automobile) as an example of a vehicle system in which the photodetection system to which the photoelectric conversion device according to the first to fourth embodiments is applied is incorporated. FIG. 15A is a schematic front view of the vehicle 500, FIG. 15B is a schematic plan view of the vehicle 500, and FIG. 15C is a schematic rear view of the vehicle 500. The vehicle 500 includes a pair of photoelectric conversion devices 502 on the front side thereof. Here, the photoelectric conversion devices 502 are the photoelectric conversion device 100 described in the first to fourth embodiments. The vehicle 500 includes an integrated circuit 503, an alert device 512, and a main control unit 513.

FIG. 16 is a block diagram illustrating a configuration example of a photodetection system 501 mounted on the vehicle 500. The photodetection system 501 includes a photoelectric conversion device 502, an image pre-processing unit 515, an integrated circuit 503, and an optical system 514. The photoelectric conversion device 502 is the photoelectric conversion device 100 described in the first embodiment. The optical system 514 forms an optical image of an object on the photoelectric conversion device 502. The photoelectric conversion device 502 converts the optical image of the object formed by the optical system 514 into an electric signal. The image pre-processing unit 515 performs predetermined signal processing on the signal output from the photoelectric conversion device 502. The function of the image pre-processing unit 515 may be incorporated in the photoelectric conversion device 502. The photodetection system 501 includes at least two sets of the optical system 514, the photoelectric conversion device 502, and the image pre-processing unit 515, and outputs from the image pre-processing unit 515 of each set are input to the integrated circuit 503.

The integrated circuit 503 is an integrated circuit for use in an imaging system, and includes an image processing unit 504, an optical ranging unit 506, a parallax calculation unit 507, an object recognition unit 508, and an abnormality detection unit 509. The image processing unit 504 processes the image signal output from the image pre-processing unit 515. For example, the image processing unit 504 performs image processing such as development processing and defect correction on the output signal of the image pre-processing unit 515. The image processing unit 504 includes a memory 505 that temporarily holds an image signal. The memory 505 may store, for example, positions of known defective pixels in the photoelectric conversion device 502.

An optical ranging unit 506 focuses and measures an object. The parallax calculation unit 507 calculates distance measurement information (distance information) from a plurality of image data (parallax images) acquired by the plurality of photoelectric conversion devices 502. Each of the photoelectric conversion devices 502 may have a configuration capable of acquiring various kinds of information such as distance information. The object recognition unit 508 recognizes an object such as a vehicle, a road, a sign, or a person. When the abnormality detection unit 509 detects an abnormality of the photoelectric conversion device 502, the abnormality detection unit 509 notifies the main control unit 513 of the abnormality.

The integrated circuit 503 may be realized by dedicated hardware, a software module, or a combination thereof. It may be realized by FPGA (Field Programmable Gate Array), ASIC (Application Specific Integrated Circuit), or the like, or may be realized by a combination of these.

The main control unit 513 controls overall operations of the photodetection system 501, the vehicle sensor 510, the control unit 520, and the like. The vehicle 500 may not include the main control unit 513. In this case, the photoelectric conversion device 502, the vehicle sensor 510, and the control unit 520 transmit and receive control signals via the communication network. For example, the CAN (Controller Area Network) standard may be applied to the transmission and reception of the control signal.

The integrated circuit 503 has a function of receiving a control signal from the main control unit 513 or transmitting a control signal or a set value to the photoelectric conversion device 502 by its own control unit.

The photodetection system 501 is connected to the vehicle sensor 510, and may detect a traveling state of the own vehicle such as a vehicle speed, a yaw rate, and a steering angle, an environment outside the own vehicle, and a state of another vehicle or obstacle. The vehicle sensor 510 is also a distance information acquisition means for acquiring distance information to an object. The photodetection system 501 is connected to a driving support control unit 511 that performs various driving support functions such as automatic steering, automatic cruise, and collision prevention function. In particular, regarding the collision determination function, the collision estimation, collision presence, and collision absence with another vehicle or obstacle are determined based on the detection result of the photodetection system 501 or the vehicle sensor 510. Thus, avoidance control when collision is estimated and start-up of the safety device at the time of collision are performed.

The photodetection system 501 is also connected to an alert device 512 that issues an alarm to the driver based on the determination result of the collision determination unit. For example, when the possibility of collision is high as the determination result of the collision determination unit, the main control unit 513 performs vehicle control for avoiding collision and reducing damage by applying a brake, returning an accelerator, suppressing engine output, or the like. The alert device 512 sounds an alarm such as a sound, displays alert information on a display unit screen of a car navigation system, a meter panel, or the like, and applies vibration to a seatbelt or a steering wheel, thereby warning the user.

In the present embodiment, an image of the periphery of the vehicle, for example, the front or the rear is taken by the photodetection system 501. FIG. 15B illustrates an arrangement example of the photodetection system 501 when an image of the front of the vehicle is captured by the photodetection system 501.

As described above, the photoelectric conversion device 502 is disposed in front of the vehicle 500. Specifically, when the center line with respect to the advancing/retracting direction or the outer shape (for example, the vehicle width) of the vehicle 500 is regarded as the axis of symmetry, and the two photoelectric conversion devices 502 are arranged in line symmetry with respect to the axis of symmetry, it is preferable in terms of acquiring distance information between the vehicle 500 and the object to be captured and determining the possibility of collision. The photoelectric conversion device 502 is preferably arranged so as not to interfere with the field of view of the driver when the driver visually recognizes the situation outside the vehicle 500 from the driver's seat. The alert device 512 is preferably arranged to easily enter the field of view of the driver.

Next, a failure detection operation of the photoelectric conversion device 502 in the photodetection system 501 will be described with reference to FIG. 16. The failure detection operation of the photoelectric conversion device 502 may be performed according to steps S110 to S180 illustrated in FIG. 16.

Step S110 is a step of performing setting at the time of startup of the photoelectric conversion device 502. That is, a setting for the operation of the photoelectric conversion device 502 is transmitted from the outside of the photodetection system 501 (for example, the main control unit 513) or from the inside of the photodetection system 501, and the imaging operation and the failure detection operation of the photoelectric conversion device 502 are started.

Next, in step S120, a pixel signal is acquired from the effective pixel. In step S130, an output value from a failure detection pixel provided for failure detection is acquired. The failure detection pixel includes a photoelectric conversion element in the same manner as the effective pixel. A predetermined voltage is written into the photoelectric conversion element. The failure detection pixel outputs a signal corresponding to the voltage written in the photoelectric conversion element. Note that steps S120 and S130 may be reversed.

Next, in step S140, a classification of the output expected value of the failure detection pixel and the actual output value from the failure detection pixel. When the output expected value matches the actual output value as a result of the classification in step S140, the process proceeds to step S150, where it is determined that the imaging operation is normally performed, and the process step proceeds to step S160. In step S160, the pixel signal of the scanning row is transmitted to the memory 505 and is primarily stored. After that, the process returns to step S120, and the failure detection operation is continued. On the other hand, when the output expected value does not match the actual output value as a result of the classification in step S140, the processing step proceeds to step S170. In step S170, it is determined that there is an abnormality in the imaging operation, and an alert is notified to the main control unit 513 or the alert device 512. The alert device 512 displays that an abnormality has been detected on the display unit. Thereafter, in step S180, the photoelectric conversion device 502 is stopped, and the operation of the photodetection system 501 is ended.

In the present embodiment, an example in which the flowchart is looped for each row is exemplified, but the flowchart may be looped for each plurality of rows, or the failure detection operation may be performed for each frame. The alarm in step S170 may be notified to the outside of the vehicle via the wireless network.

Further, in the present embodiment, the control in which the vehicle does not collide with another vehicle has been described, but the present disclosure is also applicable to a control in which the vehicle is automatically driven following another vehicle, a control in which the vehicle is automatically driven so as not to protrude from the lane, and the like. Further, the photodetection system 501 may be applied not only to a vehicle such as an own vehicle, but also to a movable object (mobile device) such as a ship, an aircraft, or an industrial robot. In addition, the present disclosure may be applied not only to a movable object but also to equipment using object recognition in a wide range such as an intelligent transport system (ITS).

Ninth Embodiment

Figure 18A:
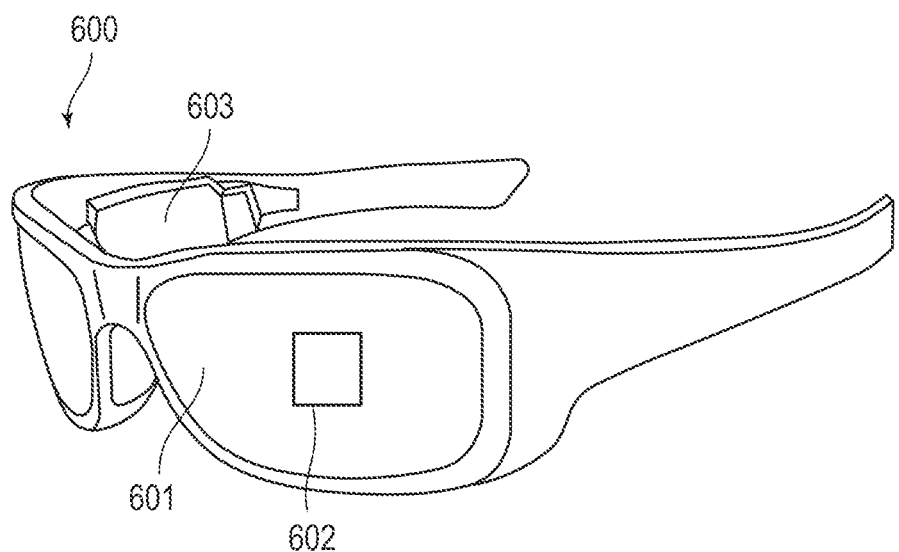
FIG. 18A and FIG. 18B are schematic diagrams illustrating a schematic configuration of a photodetection system according to a ninth embodiment of the present disclosure.
Figure 18B:
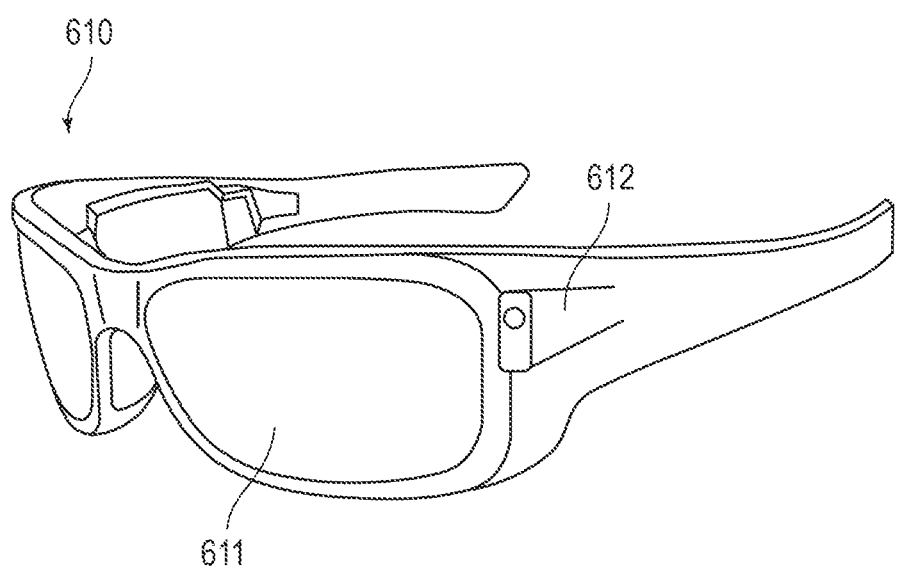

A photodetection system according to a ninth embodiment of the present disclosure will be described with reference to FIG. 18A and FIG. 18B. FIG. 18A and FIG. 18B are schematic diagrams illustrating a configuration example of the photodetection system according to the present embodiment. In the present embodiment, an application example to eyeglasses (smartglasses) will be described as a photodetection system to which the photoelectric conversion device 100 according to the first to fourth embodiments is applied.

FIG. 18A illustrates eyeglasses 600 (smartglasses) according to one application example. The eyeglasses 600 include a lens 601, a photoelectric conversion device 602, and a control device 603.

The photoelectric conversion device 602 is the photoelectric conversion device 100 described in the first embodiment, and is provided in the lens 601. One photoelectric conversion device 602 or a plurality of photoelectric conversion devices 602 may be provided. When a plurality of photoelectric conversion devices 602 are used, a plurality of types of photoelectric conversion devices 602 may be used in combination. The arrangement position of the photoelectric conversion device 602 is not limited to that illustrated in FIG. 18B. A display device (not illustrated) including a light emitting device such as an OLED or an LED may be provided on the back side of the lens 601.

The control device 603 functions as a power supply for supplying power to the photoelectric conversion device 602 and the above-described display device. The control device 603 has a function of controlling operations of the photoelectric conversion device 602 and the display device. The lens 601 is provided with an optical system for focusing light on the photoelectric conversion device 602.

FIG. 18B illustrates eyeglasses 610 (smartglasses) according to another application example. The eyeglasses 610 include a lens 611 and a control device 612. A photoelectric conversion device (not illustrated) corresponding to the photoelectric conversion device 602 and a display device may be mounted on the control device 612.

The lens 611 is provided with a photoelectric conversion device in the control device 612 and an optical system for projecting light from the display device, and an image is projected thereon. The control device 612 functions as a power supply for supplying power to the photoelectric conversion device and the display device, and has a function of controlling the operation of the photoelectric conversion device and the display device.

The control device 612 may further include a line-of-sight detection unit that detects the line of sight of the wearer. In this case, the control device 612 is provided with an infrared light emitting unit, and the infrared light emitted from the infrared light emitting unit may be used to detect the line of sight. Specifically, the infrared light emitting unit emits infrared light to the eyeball of the user who is looking at the display image. A captured image of the eyeball is obtained by detecting reflected light of the emitted infrared light from the eyeball by an imaging unit having a light receiving element. The reduction means for reducing light from the infrared light emitting unit to the display unit in a plan view may reduce deterioration in image quality.

The line of sight of the user with respect to the display image may be detected from the captured image of the eyeball obtained by capturing infrared light. Any known method may be applied to line-of-sight detection using a captured image of an eyeball. As an example, a line-of-sight detection method based on a Purkinje image caused by reflection of irradiation light on the cornea may be used. More specifically, line-of-sight detection processing based on the pupil cornea reflection method is performed. A line of sight of the user is detected by calculating a line of sight vector representing the direction (rotation angle) of the eyeball based on the pupil image and the Purkinje image included in the captured image of the eyeball using the pupil cornea reflection method.

The display device according to the present embodiment may include a photoelectric conversion device having a light receiving element, and may be configured to control a display image based on line-of-sight information of a user from the photoelectric conversion device. Specifically, the display device determines, based on the line-of-sight information, a first viewing area to be gazed by the user and a second viewing area other than the first viewing area. The first viewing area and the second viewing area may be determined by a control device of the display device or may be determined by an external control device. When the determination is made by the external control device, the determination is transmitted to the display device via the communication. In the display area of the display device, the display resolution of the first viewing area may be controlled to be higher than the display resolution of the second viewing area. That is, the resolution of the second viewing area may be lower than the resolution of the first viewing area.

The display area may include a first display area and a second display area different from the first display area, and may be configured to determine an area having a high priority from the first display area and the second display area based on the line-of-sight information. The first display area and the second display area may be determined by a control device of the display device or may be determined by an external control device. When the determination is made by the external control device, the determination is transmitted to the display device via the communication. The resolution of the high priority region may be controlled to be higher than the resolution of the regions other than the high priority region. That is, the resolution of a region having a relatively low priority may be low.

Note that an AI (artificial intelligence) may be used to determine the first viewing area or the region with high priority. The AI may be a model configured to estimate an angle of a line of sight and a distance to a target object ahead of the line of sight from an image of an eyeball and a direction in which the eyeball of the image is actually viewed as teacher data. The AI program may be provided by a display device, a photoelectric conversion device, or an external device. When the external device has the function, the function is transmitted to the display device via the communication.

In the case of performing display control based on visual recognition detection, the present invention may be preferably applied to smart glasses further including a photoelectric conversion device for imaging an external image. The smart glasses may display the captured external information in real time.

Modified Embodiments

The present disclosure is not limited to the above embodiments, and various modifications are possible.

For example, an example in which a configuration of a part of any embodiment is added to another embodiment or an example in which a configuration of a part of another embodiment is substituted is also an embodiment of the present disclosure.

Although the openings 158 are provided inside the outer periphery of the interconnection 156 in a plan view in the first embodiment, the openings 158 are not necessarily provided inside the outer periphery of the interconnection 156. That is, the opening 158 may constitute a part of the outer periphery of the interconnection 156. A part of the opening 158 may not overlap the avalanche multiplication region 130 in a plan view.

The configuration of the pixel 12 described in the first embodiment is an example, and the present disclosure is not limited thereto.

For example, in the first embodiment, the configuration is such that a signal is output from the connection node between the cathode of the photon detection element 22 and the quenching element 24, but the configuration of the photoelectric conversion unit 20 is not limited to this. For example, the quenching element 24 may be connected to the anode side of the photon detection element 22, and a signal may be output from a connection node between the anode of the photon detection element 22 and the quenching element 24.

Further, a switch such as a transistor may be provided between the photon detection element 22 and the quenching element 24 and/or between the photoelectric conversion unit 20 and the pixel signal processing unit 30 to control an electrical connection state between them. Further, a switch such as a transistor may be provided between the node to which the voltage VH is supplied and the quenching element 24 and/or between the node to which the voltage VL is supplied and the photon detection element 22 to control the electrical connection state therebetween.

Although the counter is exemplified as the processing circuit 34 in the first embodiment, the processing circuit 34 may be configured by a TDC (Time to Digital Converter) and a memory. In this case, the generation timing of the pulse signal output from the waveform shaping circuit 32 is converted into a digital signal by the TDC. When the timing of the pulse signal is measured, the control pulse pREF (reference signal) is supplied from the vertical scanning circuit unit 40 to the TDC via the control line 14. The TDC acquires, as a digital signal, a signal obtained by setting the input timing of the signal output from each pixel 12 as a relative time with reference to the control pulse pREF.

Although the photon detection elements 22 arranged adjacent to each other are electrically isolated from each other by the p-type semiconductor regions 132 and 134 in the above embodiment, element isolation structures such as DTI (Deep Trench Isolation) may be further provided inside the p-type semiconductor region 132. The element isolation structure may be provided so as to reach the second surface 124 from the first surface 122 of the semiconductor layer 120, or may be provided in a part in the depth direction between the first surface 122 and the second surface 124. The element isolation structure disposed inside the p-type semiconductor region 132 may have a two-layer structure including a reflecting member reflecting light and an insulating member. With this configuration, the sensitivity may be further improved.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:
1. A photoelectric conversion device comprising:
a semiconductor layer provided with an avalanche photodiode; and
an interconnection structure layer provided on a side of a first surface of the semiconductor layer,
wherein the interconnection structure layer includes an interconnection structure made of a metal material and overlapping with an avalanche multiplication region of the avalanche photodiode in a plan view,
wherein the interconnection structure includes a first interconnection, a second interconnection disposed farther away from the first surface than the first interconnection, and a contact electrode electrically connecting the first interconnection and the second interconnection,
wherein an opening is provided in the first interconnection in a portion overlapping with the avalanche multiplication region in the plan view,
wherein the second interconnection is disposed so as to overlap with an entire of the opening in the plan view,
wherein the contact electrode is disposed around the opening in the plan view,
wherein the contact electrode includes, in a cross-sectional view, a first contact portion and a second contact portion disposed around the opening, and each of the first contact portion and the second contact portion is connected to the second interconnection, and
wherein the contact electrode has a tapered shape in which a width on a side of the first interconnection is narrower than a width on a side of the second interconnection.

2. The photoelectric conversion device according to claim 1,
wherein the interconnection structure layer further includes a first insulating film disposed between the first interconnection and the second interconnection, and a second insulating film disposed between the first insulating film and the semiconductor layer, and
wherein a refractive index of the first insulating film is higher than a refractive index of the second insulating film.

3. The photoelectric conversion device according to claim 1, wherein the avalanche multiplication region is arranged inside an outer periphery of the first interconnection in the plan view.

4. The photoelectric conversion device according to claim 1, wherein the interconnection structure is electrically connected to the avalanche photodiode.

5. The photoelectric conversion device according to claim 1, wherein at least one of the first interconnection, the second interconnection, and the contact electrode is made of the metal material including copper.

6. The photoelectric conversion device according to claim 1, wherein the interconnection structure layer includes an antireflection layer disposed on the first surface of the semiconductor layer.

7. The photoelectric conversion device according to claim 1, wherein a plurality of openings is provided in the first interconnection.

8. The photoelectric conversion device according to claim 7, wherein the second interconnection is disposed so as to overlap with the plurality of openings.

9. The photoelectric conversion device according to claim 7, wherein a plurality of second interconnections corresponding to the plurality of openings is provided.

10. The photoelectric conversion device according to claim 1, wherein a plurality of contact electrodes is arranged to surround the opening.

11. The photoelectric conversion device according to claim 10,
wherein the opening has a polygonal shape in the plan view, and
wherein at least one contact electrode is arranged corresponding to each side of the polygon shape.

12. The photoelectric conversion device according to claim 1, wherein the contact electrode has a frame-like structure surrounding the opening.

13. The photoelectric conversion device according to claim 1,
wherein the semiconductor layer includes a plurality of avalanche photodiodes and an isolation portion that isolates the plurality of avalanche photodiodes from each other, and
wherein the isolation portion includes a reflecting member that reflects light.

14. The photoelectric conversion device according to claim 1 further comprising an optical structure layer provided on a side of a second surface of the semiconductor layer that is opposite to the first surface of the semiconductor layer.

15. The photoelectric conversion device according to claim 1 comprising a plurality of pixels each including a photoelectric conversion unit including the avalanche photodiode and outputting a signal corresponding to incident of photons, a processing circuit that processes the signal output from the photoelectric conversion unit, and a pixel output circuit that controls an output of the signal processed by the processing circuit.

16. The photoelectric conversion device according to claim 15 comprising a first substrate provided with at least the avalanche photodiode of the photoelectric conversion unit and a second substrate provided with the processing circuit and the pixel output circuit and stacked on the first substrate.

17. The photoelectric conversion device according to claim 1, wherein the interconnection structure overlaps with an entire of the avalanche multiplication region of the avalanche photodiode in the plan view.

18. A photodetection system comprising:
the photoelectric conversion device according to claim 1; and
a signal processing device that processes a signal output from the photoelectric conversion device.

19. The photodetection system according to claim 18, wherein the signal processing device generates a distance image representing distance information to an object based on the signal.

20. A movable object comprising:
the photoelectric conversion device according to claim 1;
a distance information acquisition unit that acquires distance information to an object from a parallax image based on a signal output from the photoelectric conversion device; and
a control unit that controls the movable object based on the distance information.

* * * * *